United States Patent
Lee et al.

(10) Patent No.: US 11,120,854 B2
(45) Date of Patent: Sep. 14, 2021

(54) SEMICONDUCTOR DEVICE

(71) Applicant: SK hynix Inc., Icheon-si (KR)

(72) Inventors: Seong Ju Lee, Hwaseong-si (KR); Ju Hyuck Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/878,077

(22) Filed: May 19, 2020

(65) Prior Publication Data

US 2021/0134335 A1 May 6, 2021

(30) Foreign Application Priority Data

Oct. 30, 2019 (KR) .................. 10-2019-0136531

(51) Int. Cl.
| | |
|---|---|
| *G11C 8/00* | (2006.01) |
| *G11C 7/22* | (2006.01) |
| *G11C 7/10* | (2006.01) |

(52) U.S. Cl.
CPC .............. *G11C 7/222* (2013.01); *G11C 7/106* (2013.01); *G11C 7/1045* (2013.01); *G11C 7/1057* (2013.01); *G11C 7/1084* (2013.01); *G11C 7/1087* (2013.01)

(58) Field of Classification Search
CPC ....... G11C 7/222; G11C 7/106; G11C 7/1045; G11C 7/1057; G11C 7/1084
See application file for complete search history.

(56) References Cited

U.S. PATENT DOCUMENTS

| | | | | |
|---|---|---|---|---|
| 2005/0141331 | A1* | 6/2005 | Cho ..................... | G11C 7/1078 365/233.1 |
| 2005/0185484 | A1* | 8/2005 | Jang .................... | G11C 7/1066 365/201 |
| 2007/0260925 | A1* | 11/2007 | Do ........................ | G11C 29/48 714/30 |
| 2009/0168548 | A1* | 7/2009 | Na ....................... | G11C 7/1057 365/189.05 |
| 2010/0124129 | A1* | 5/2010 | Lee ..................... | G11C 7/1096 365/189.16 |

FOREIGN PATENT DOCUMENTS

KR    1020100055708 A    5/2010

* cited by examiner

*Primary Examiner* — Toan K Le
(74) *Attorney, Agent, or Firm* — William Park & Associates Ltd.

(57) ABSTRACT

A semiconductor device includes an internal clock generation circuit configured to generate first to fourth internal clocks from first and third divided clocks and a ground voltage in first and second modes. The semiconductor device also includes a data processing circuit configured to latch first to fourth internal data according to first to fourth input control signals. The data processing circuit is additionally configured to generate first to fourth output data by determining the output priority of the latched first and third internal data and the latched second and fourth internal data according to the first to fourth internal clocks, first to fourth rising output control signals, and first to fourth falling output control signals.

30 Claims, 17 Drawing Sheets

SEMICONDUCTOR DEVICE

CROSS-REFERENCE TO RELATED APPLICATION

The present application claims priority under 35 U.S.C. § 119(a) to Korean Patent Application No. 10-2019-0136531 filed on Oct. 30, 2019, in the Korean Intellectual Property Office, which is incorporated herein by reference in its entirety.

BACKGROUND

1. Technical Field

Embodiments of the present disclosure relate to a semiconductor device that outputs data in synchronization with frequency-divided internal clocks.

2. Related Art

In general, a semiconductor device including DDR SDRAM (Double Data Rate Synchronous DRAM) performs a data read/write operation according to a command inputted from an external chip set. The semiconductor device needs to include various circuits therein in order to perform such a read/write operation, and the various circuits include a pipe latch circuit for efficiently controlling more data. In general, the pipe latch circuit, which is configured to store a plurality of input signals at desired timings, respectively, and output the plurality of input signals at desired timings, respectively, may be included in the semiconductor device, and increase the signal transmitting/receiving capacity between the internal circuits or between an external device of the semiconductor device and the internal circuits of the semiconductor device.

The semiconductor device including DDR SDRAM uses various methods to increase operation speed. As a representative example, the semiconductor device may generate a plurality of divided clocks by dividing the frequency of a clock inputted from the outside, and control the pipe latch circuit to operate in synchronization with the plurality of divided clocks, in order to increase the operation speed.

The semiconductor device supports an operation for determining a data input/output order, and supports an operation of changing an output order of even data and odd data.

SUMMARY

A semiconductor device in accordance with an embodiment includes an internal clock generation circuit configured to generate a first internal clock, a second internal clock, a third internal clock, and a fourth internal clock from a first divided clock, a third divided clock, and a ground voltage in a first mode and a second mode. The semiconductor device also includes a data processing circuit configured to latch first internal data, second internal data, third internal data, and fourth internal data according to a first input control signal, a second input control signal, a third input control signal, and a fourth input control signal. The data processing circuit is further configured to generate first output data, second output data, third output data, and fourth output data by determining the output priority of the latched first and third internal data and the latched second and fourth internal data according to the first to fourth internal clocks, a first rising output control signal, a second rising output control signal, a third rising output control signal, a fourth rising output control signal, a first falling output control signal, a second falling output control signal, a third falling output control signal, and a fourth falling output control signal.

Another semiconductor device in accordance with an embodiment includes a mode setting circuit configured to generate a first mode setting signal, a second mode setting signal, and a third mode setting signal according to a combination of a first mode signal and a second mode signal. The semiconductor device also includes an internal clock generation circuit configured to generate a first internal clock, a second internal clock, a third internal clock, and a fourth internal clock from a first divided clock, a second divided clock, a third divided clock, a fourth divided clock, and a ground voltage according to the first to third mode setting signals. The semiconductor device further includes a data processing circuit configured to latch first internal data, second internal data, third internal data, and fourth internal data according to a first input control signal, a second input control signal, a third input control signal, and a fourth input control signal. The data processing circuit is additionally configured to generate first output data, second output data, third output data and fourth output data by determining the output priority of the latched first and third internal data and the latched second and fourth internal data according to the first to fourth internal clocks, a first rising output control signal, a second rising output control signal, a third rising output control signal, a fourth rising output control signal, a first falling output control signal, a second falling output control signal, a third falling output control signal, and a fourth falling output control signal.

In accordance with an embodiment, the semiconductor device is configured to selectively generate the plurality of internal clocks for determining the input/output order of data from the plurality of divided clocks and the ground voltage according to the operation mode, and determine the input/output order of the data in synchronization with the selectively generated internal clocks, thereby outputting the data at high speed.

Furthermore, the semiconductor device in accordance with an embodiment determines the input/output order of data in synchronization with the plurality of internal clocks which are selectively generated according to the operation mode, and does not require a separate circuit for changing the data input/output order, which makes it possible to reduce the area.

Furthermore, the semiconductor device in accordance with an embodiment determines the input/output order of data in synchronization with the plurality of internal clocks which are selectively generated according to the operation mode, and does not require a separate circuit for changing the data input/output order, which makes it possible to reduce the current consumption.

DETAILED DESCRIPTION

Hereinafter, a semiconductor device is described with reference to the accompanying drawings through various embodiments. It should be noted that the embodiments are only examples for describing the present disclosure, and the scope of the present disclosure is not limited thereto.

Various embodiments are directed to a semiconductor device which can selectively generate a plurality of internal clocks for determining the input/output order of data from a plurality of divided clocks and a ground voltage according to an operation mode, and determine the input/output order of data in synchronization with the plurality of internal clocks which are selectively generated.

Figure 1:
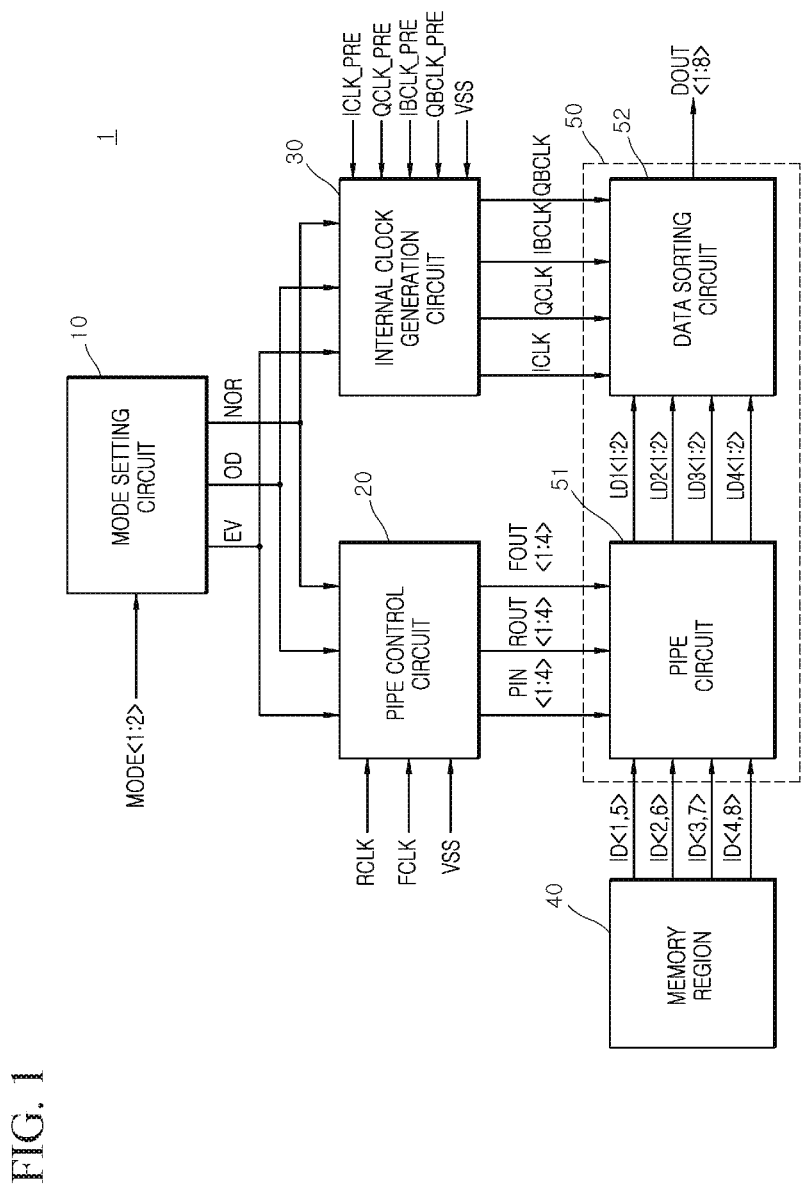
FIG. 1 is a block diagram illustrating a configuration of a semiconductor device in accordance with an embodiment.

As illustrated in FIG. 1, a semiconductor device 1 in accordance with an embodiment may include a mode setting circuit 10, a pipe control circuit 20, an internal clock generation circuit 30, a memory region 40, and a data processing circuit 50.

The mode setting circuit 10 may generate a first mode setting signal EV, a second mode setting signal OD, and a third mode setting signal NOR, which are selectively enabled according to a combination of the logic levels of first and second mode signals MODE<1:2>. The mode setting circuit 10 may generate the first mode setting signal EV which is enabled in a first mode according to the combination of the logic levels of the first and second mode signals MODE<1:2>. The mode setting circuit 10 may generate the second mode setting signal OD which is enabled in a second mode according to the combination of the logic levels of the first and second mode signals MODE<1:2>. The mode setting circuit 10 may generate the third mode setting signal NOR which is enabled in a third mode according to the combination of the logic levels of the first and second mode signals MODE<1:2>. The first mode may be set to a mode for outputting a second bit ID<2>, a fourth bit ID<4>, a sixth bit ID<6>, and an eighth bit ID<8> of internal data, after outputting a first bit ID<1>, a third bit ID<3>, a fifth bit ID<5>, and a seventh bit ID<7> of the internal data. The second mode may be set to a mode for outputting the first bit ID<1>, the third bit ID<3>, the fifth bit ID<5> and the seventh bit ID<7> of the internal data, after outputting the second bit ID<2>, the fourth bit ID<4>, the sixth bit ID<6>, and the eighth bit ID<8> of the internal data. The third mode may be set to a mode for outputting the first to eighth bits ID<1:8> of the internal data without changing the order of the first to eighth bits ID<1:8> of the internal data. As used herein, first to Nth, where N is a counting number, refers to first, second, third, . . . Nth. For example, "first to eighth bits" includes a first bit, a second bit, a third bit, a fourth bit, a fifth bit, a sixth bit, a seventh bit, and an eighth bit.

The pipe control circuit 20 may enter the first to third modes to generate first to fourth input control signals PIN<1:4> from a rising clock RCLK and a falling clock FCLK. The pipe control circuit 20 may generate the first to fourth input control signals PIN<1:4> from the rising clock RCLK and the falling clock FCLK when any one of the first to third mode setting signals EV, OD, and NOR is enabled.

When entering the first mode, the pipe control circuit 20 may generate first and third rising output control signals ROUT<1,3> from the rising clock RCLK, the falling clock FCLK, and a ground voltage VSS, and then generate second and fourth falling output control signals FOUT<2,4>. When the first mode setting signal EV is enabled, the pipe control circuit 20 may generate the first and third rising output control signals ROUT<1,3> from the rising clock RCLK, the falling clock FCLK, and the ground voltage VSS, and then generate the second and fourth falling output control signals FOUT<2,4>.

When entering the second mode, the pipe control circuit 20 may generate second and fourth rising output control signals ROUT<2,4> from the rising clock RCLK, the falling clock FCLK, and the ground voltage VSS, and then generate first and third falling output control signals FOUT<1,3>. When the second mode setting signal OD is enabled, the pipe control circuit 20 may generate the second and fourth rising output control signals ROUT<2,4> from the rising clock RCLK, the falling clock FCLK, and the ground voltage VSS, and then generate the first and third falling output control signals FOUT<1,3>.

When entering the third mode, the pipe control circuit 20 may generate the first to fourth rising output control signals ROUT<1:4> from the rising clock RCLK and the falling clock FCLK. When the third mode setting signal NOR is enabled, the pipe control circuit 20 may generate the first to fourth rising output control signals ROUT<1:4> from the rising clock RCLK and the falling clock FCLK. Although the pipe control circuit 20 is configured to generate the first to fourth rising output control signals ROUT<1:4> when the third mode setting signal NOR is enabled, the pipe control circuit 20 may be configured to generate the first to fourth falling output control signals FOUT<1:4> in another embodiment. The rising clock RCLK may be set to a signal which toggles in synchronization with a rising edge of a clock inputted from the outside. The falling clock FCLK may be set to a signal which toggles in synchronization with a falling edge of the clock inputted from the outside. The ground voltage VSS may be set to a general ground voltage used in the semiconductor device 1.

When entering the first mode, the internal clock generation circuit 30 may generate a first internal clock ICLK and a third internal clock IBCLK from a first divided clock ICLK_PRE, a third divided clock IBCLK_PRE, and the ground voltage VSS, and then generate a second internal clock QCLK and a fourth internal clock QBCLK. When the first mode setting signal EV is enabled, the internal clock generation circuit 30 may generate the first internal clock ICLK and the third internal clock IBCLK from the first divided clock ICLK_PRE, the third divided clock IBCLK_PRE, and the ground voltage VSS, and then generate the second internal clock QCLK and the fourth internal clock QBCLK.

When entering the second mode, the internal clock generation circuit 30 may generate the second internal clock QCLK and the fourth internal clock QBCLK from a second divided clock QCLK_PRE, a fourth divided clock QBCLK_PRE, and the ground voltage VSS, and then generate the first internal clock ICLK and the third internal clock IBCLK. When the second mode setting signal OD is enabled, the internal clock generation circuit 30 may generate the second internal clock QCLK and the fourth internal clock QBCLK from the second divided clock QCLK_PRE, the fourth divided clock QBCLK_PRE, and the ground voltage VSS, and then generate the first internal clock ICLK and the third internal clock IBCLK.

When entering the third mode, the internal clock generation circuit 30 may generate the first internal clock ICLK, the second internal clock QCLK, the third internal clock IBCLK, and the fourth internal clock QBCLK from the first divided clock ICLK_PRE, the second divided clock QCLK_PRE, the third divided clock IBCLK_PRE, and the fourth divided clock QBCLK_PRE. When the third mode setting signal NOR is enabled, the internal clock generation circuit 30 may generate the first internal clock ICLK, the second internal clock QCLK, the third internal clock IBCLK, and the fourth internal clock QBCLK from the first divided clock ICLK_PRE, the second divided clock QCLK_PRE, the third divided clock IBCLK_PRE, and the fourth divided clock QBCLK_PRE. The first divided clock ICLK_PRE, the second divided clock QCLK_PRE, the third divided clock IBCLK_PRE, and the fourth divided clock QBCLK_PRE may be set to signals which are generated by dividing the frequency of the clock inputted from the outside. The first divided clock ICLK_PRE, the second divided clock QCLK_PRE, the third divided clock IBCLK_PRE, and the fourth divided clock QBCLK_PRE may be set to signals including one or more pulses. The first divided clock ICLK_PRE, the second divided clock QCLK_PRE, the third divided clock IBCLK_PRE, and the fourth divided clock QBCLK_PRE may be set to signals having different phases.

The memory region 40 may output the first to eighth bits ID<1:8> of the internal data stored therein in the first to third modes. The first bit ID<1> and the fifth bit ID<5> of the internal data may be successively outputted through the same input/output line. The second bit ID<2> and the sixth bit ID<6> of the internal data may be successively outputted through the same input/output line. The third bit ID<3> and the seventh bit ID<7> of the internal data ID<1:8> may be successively outputted through the same input/output line. The fourth bit ID<4> and the eighth bit ID<8> of the internal data may be successively outputted through the same input/output line.

The data processing circuit 50 may include a pipe circuit 51 and a data sorting circuit 52.

The pipe circuit 51 may latch the first to eighth bits ID<1:8> of the internal data according to the first to fourth input control signals PIN<1:4>. The pipe circuit 51 may output the latched first to eighth bits ID<1:8> of the internal data as first latch data LD1<1:2>, second latch data LD2<1:2>, third latch data LD3<1:2>, and fourth latch data LD4<1:2>, according to the first to fourth rising output control signals ROUT<1:4> and the first to fourth falling output control signals FOUT<1:4>.

The data sorting circuit 52 may generate first to eighth output data DOUT<1:8> from the first latch data LD1<1:2>, the second latch data LD2<1:2>, the third latch data LD3<1:2>, and the fourth latch data LD4<1:2> in synchronization with the first internal clock ICLK, the second internal clock QCLK, the third internal clock IBCLK and the fourth internal clock QBCLK.

The data processing circuit 50 may latch the first to eighth bits ID<1:8> of the internal data according to the first to fourth input control signals PIN<1:4>. The data processing circuit 50 may generate the first to eighth output data DOUT<1:8> by determining the output priority of the latched first to eighth bits ID<1:8> of the internal data according to the first internal clock ICLK, the second internal clock QCLK, the third internal clock IBCLK and the fourth internal clock QBCLK, the first to fourth rising output control signals ROUT<1:4>, and the first to fourth falling output control signals FOUT<1:4>.

Figure 2:
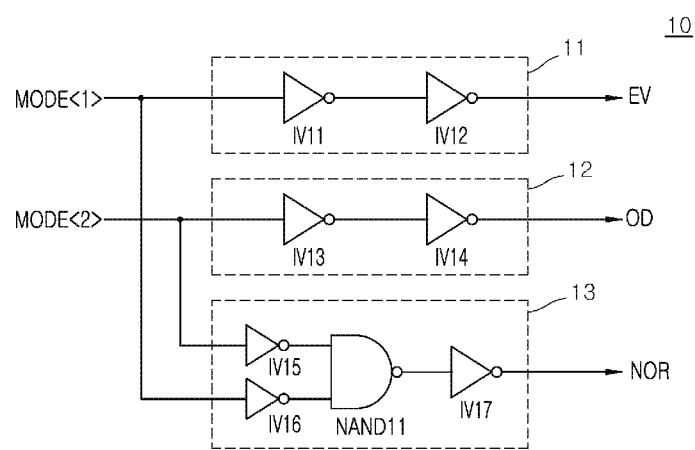
FIG. 2 is a circuit diagram illustrating a configuration of a mode setting circuit included in the semiconductor device illustrated in FIG. 1.

Referring to FIG. 2, the mode setting circuit 10 may include a first logic circuit 11, a second logic circuit 12, and a third logic circuit 13.

The first logic circuit 11 may include inverters IV11 and IV12. The first logic circuit 11 may generate the first mode setting signal EV by buffering the first mode signal MODE<1>. The first mode setting signal EV may be set to a signal which is enabled to a logic high level to enter the first mode.

The second logic circuit 12 may include inverters IV13 and IV14. The second logic circuit 12 may generate the second mode setting signal OD by buffering the second mode signal MODE<2>. The second mode setting signal OD may be set to a signal which is enabled to a logic high level to enter the second mode.

The third logic circuit 13 may include inverters IV15, IV16, and IV17 and a NAND gate NAND11. The third logic circuit 13 may generate the third mode setting signal NOR according to the logic levels of the first mode signal MODE<1> and the second mode signal MODE<2>. The third mode setting signal NOR may be set to a signal which is enabled to a logic high level to enter the third mode.

The mode setting circuit 10 may generate the first mode setting signal EV which is enabled to a logic high level when the first mode signal MODE<1> is at a logic high level and the second mode signal MODE<2> is at a logic low level, in order to enter the first mode. The mode setting circuit 10 may generate the second mode setting signal OD which is enabled to a logic high level when the first mode signal MODE<1> is at a logic low level and the second mode signal MODE<2> is at a logic high level, in order to enter the second mode. The mode setting circuit 10 may generate the third mode setting signal NOR which is enabled to a logic high level when the first mode signal MODE<1> is at a logic low level and the second mode signal MODE<2> is at a logic low level, in order to enter the third mode.

Figure 3:
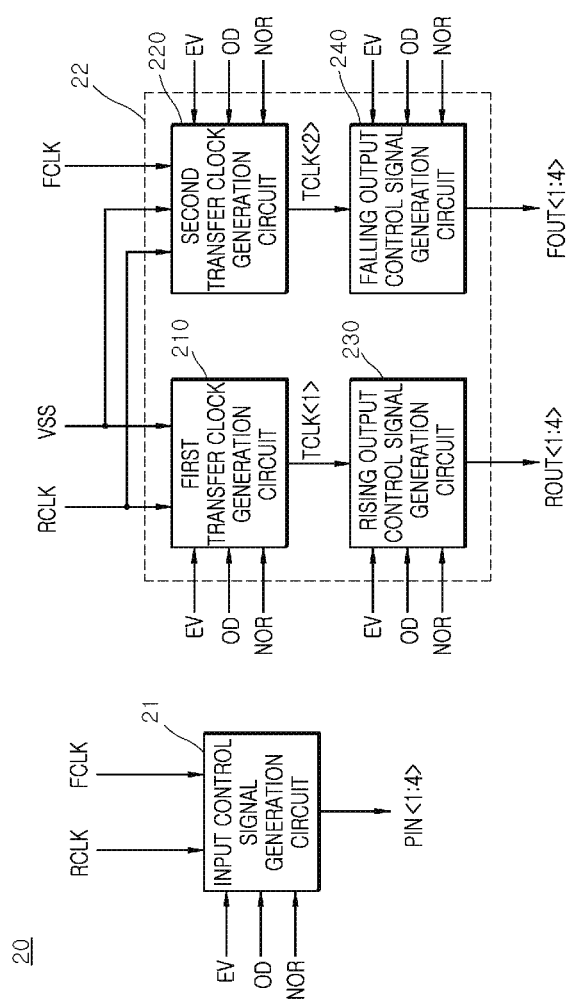
FIG. 3 is a block diagram illustrating a configuration of a pipe control circuit included in the semiconductor device illustrated in FIG. 1.

Referring to FIG. 3, the pipe control circuit 20 may include an input control signal generation circuit 21 and an output control signal generation circuit 22.

The input control signal generation circuit 21 may generate the first to fourth input control signals PIN<1:4> which are simultaneously enabled to a logic high level by the rising clock RCLK and the falling clock FCLK when any one of the first to third mode setting signals EV, OD, and NOR is enabled to a logic high level. The first to fourth input control signals PIN<1:4> may be generated as signals including high-level first and second pulses.

The output control signal generation circuit 22 may include a first transfer clock generation circuit 210, a second transfer clock generation circuit 220, a rising output control signal generation circuit 230, and a falling output control signal generation circuit 240.

The first transfer clock generation circuit 210 may generate a first transfer clock TCLK<1> from the rising clock RCLK and the ground voltage VSS according to the first mode setting signal EV, the second mode setting signal OD, and the third mode setting signal NOR. The first transfer clock generation circuit 210 may generate the first transfer clock TCLK<1> from the rising clock RCLK when the first mode setting signal EV is enabled to a logic high level. The first transfer clock generation circuit 210 may generate the first transfer clock TCLK<1> from the ground voltage VSS when the second mode setting signal OD is enabled to a logic high level. The first transfer clock generation circuit 210 may generate the first transfer clock TCLK<1> from the rising clock RCLK when the third mode setting signal NOR is enabled to a logic high level.

The second transfer clock generation circuit 220 may generate a second transfer clock TCLK<2> from the rising clock RCLK, the falling clock FCLK, and the ground voltage VSS according to the first mode setting signal EV, the second mode setting signal OD, and the third mode setting signal NOR. The second transfer clock generation circuit 220 may generate the second transfer clock TCLK<2> from the ground voltage VSS when the first mode setting signal EV is enabled to a logic high level. The second transfer clock generation circuit 220 may generate the second transfer clock TCLK<2> from the rising clock RCLK when the second mode setting signal OD is enabled to a logic high level. The second transfer clock generation circuit 220 may generate the second transfer clock TCLK<2> from the falling clock FCLK when the third mode setting signal NOR is enabled to a logic high level.

The rising output control signal generation circuit 230 may generate the first to fourth rising output control signals ROUT<1:4> in synchronization with the first transfer clock TCLK<1> according to the first mode setting signal EV, the second mode setting signal OD, and the third mode setting signal NOR. When the first mode setting signal EV is enabled to a logic high level, the rising output control signal generation circuit 230 may generate the first and third rising output control signals ROUT<1,3> in synchronization with the first transfer clock TCLK<1>. When the second mode setting signal OD is enabled to a logic high level, the rising output control signal generation circuit 230 may generate the second and fourth rising output control signals ROUT<2,4> in synchronization with the first transfer clock TCLK<1>. When the third mode setting signal NOR is enabled to a logic high level, the rising output control signal generation circuit 230 may generate the first to fourth rising output control signals ROUT<1:4> in synchronization with the first transfer clock TCLK<1>.

The falling output control signal generation circuit 240 may generate the first to fourth falling output control signals FOUT<1:4> in synchronization with the second transfer clock TCLK<2> according to the first mode setting signal EV, the second mode setting signal OD, and the third mode setting signal NOR. When the first mode setting signal EV is enabled to a logic high level, the falling output control signal generation circuit 240 may generate the second and fourth falling output control signals FOUT<2,4> in synchronization with the second transfer clock TCLK<2>. When the second mode setting signal OD is enabled to a logic high level, the falling output control signal generation circuit 240 may generate the first and third falling output control signals FOUT<1,3> in synchronization with the second transfer clock TCLK<2>. When the third mode setting signal NOR is enabled to a logic high level, the falling output control signal generation circuit 240 may generate the first to fourth falling output control signals FOUT<1:4> disabled to a logic low level.

The output control signal generation circuit 22 may generate the first to fourth rising output control signals ROUT<1:4> from the rising clock RCLK, the falling clock FCLK, and the ground voltage VSS according to the first mode setting signal EV, the second mode setting signal OD, and the third mode setting signal NOR. The output control signal generation circuit 22 may generate the first to fourth falling output control signals FOUT<1:4> from the rising clock RCLK, the falling clock FCLK, and the ground voltage VSS according to the first mode setting signal EV, the second mode setting signal OD, and the third mode setting signal NOR.

Figure 4:
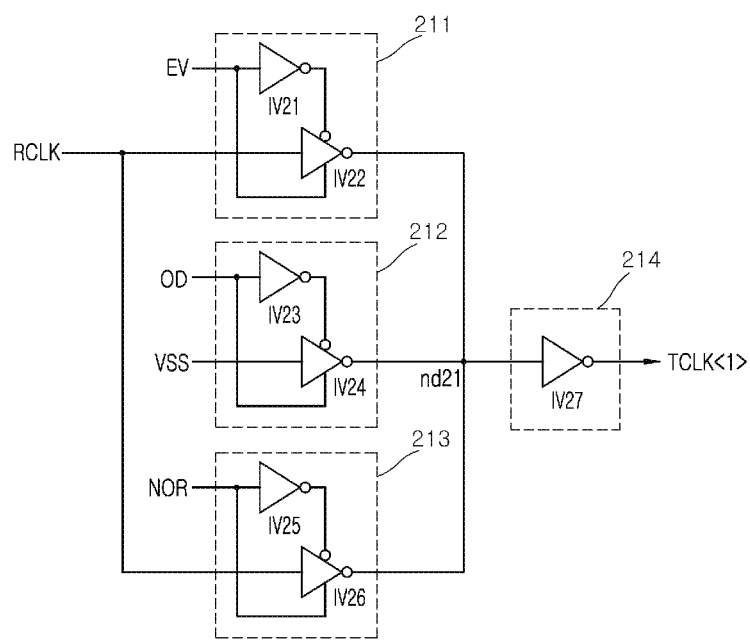
FIG. 4 is a circuit diagram illustrating a configuration of a first transfer clock generation circuit included in the pipe control circuit illustrated in FIG. 3.

Referring to FIG. 4, the first transfer clock generation circuit 210 may include a first clock transfer circuit 211, a second clock transfer circuit 212, a third clock transfer circuit 213, and a first transfer clock output circuit 214.

The first clock transfer circuit 211 may include inverters IV21 and IV22. The first clock transfer circuit 211 may invert and buffer the rising clock RCLK and output the inverted and buffered signal to a node nd21, when the first mode setting signal EV is enabled to a logic high level.

The second clock transfer circuit 212 may include inverters IV23 and IV24. The second clock transfer circuit 212 may invert and buffer the ground voltage VSS and output the inverted and buffered signal to the node nd21, when the second mode setting signal OD is enabled to a logic high level.

The third clock transfer circuit 213 may include inverters IV25 and IV26. The third clock transfer circuit 213 may invert and buffer the rising clock RCLK and output the inverted and buffered signal to the node nd21, when the third mode setting signal NOR is enabled to a logic high level.

The first transfer clock output circuit 214 may include an inverter IV27. The first transfer clock output circuit 214 may invert and buffer the signal of the node nd21, and output the inverted and buffered signal as the first transfer clock TCLK<1>.

Figure 5:
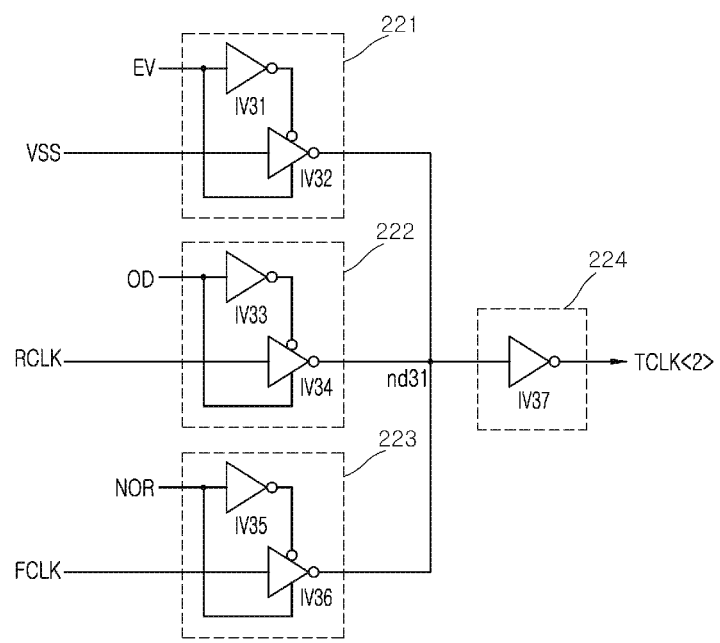
FIG. 5 is a circuit diagram illustrating a configuration of a second transfer clock generation circuit included in the pipe control circuit illustrated in FIG. 3.

Referring to FIG. 5, the second transfer clock generation circuit 220 may include a fourth clock transfer circuit 221, a fifth clock transfer circuit 222, a sixth clock transfer circuit 223, and a second transfer clock output circuit 224.

The fourth clock transfer circuit 221 may include inverters IV31 and IV32. The fourth clock transfer circuit 221 may invert and buffer the ground voltage VSS and output the inverted and buffered signal to a node nd31, when the first mode setting signal EV is enabled to a logic high level.

The fifth clock transfer circuit 222 may include inverters IV33 and IV34. The fifth clock transfer circuit 222 may invert and buffer the rising clock RCLK and output the inverted and buffered signal to the node nd31, when the second mode setting signal OD is enabled to a logic high level.

The sixth clock transfer circuit 223 may include inverters IV35 and IV36. The sixth clock transfer circuit 223 may invert and buffer the falling clock FCLK and output the inverted and buffered signal to the node nd31, when the third mode setting signal NOR is enabled to a logic high level.

The second transfer clock output circuit 224 may include an inverter IV37. The second transfer clock output circuit 224 may invert and buffer the signal of the node nd31, and output the inverted and buffered signal as the second transfer clock TCLK<2>.

Figure 6:
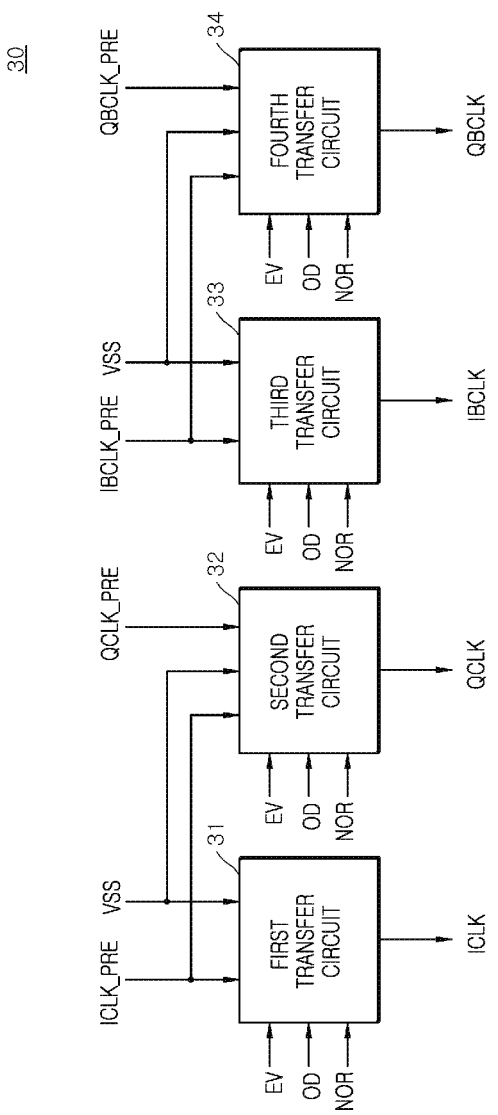
FIG. 6 is a block diagram illustrating a configuration of an internal clock generation circuit included in the semiconductor device illustrated in FIG. 1.

Referring to FIG. 6, the internal clock generation circuit 30 may include a first transfer circuit 31, a second transfer circuit 32, a third transfer circuit 33, and a fourth transfer circuit 34.

The first transfer circuit 31 may generate the first internal clock ICLK from the first divided clock ICLK_PRE or the ground voltage VSS according to the first mode setting signal EV, the second mode setting signal OD, and the third mode setting signal NOR. The first transfer circuit 31 may generate the first internal clock ICLK from the first divided clock ICLK_PRE when the first mode setting signal EV is enabled to a logic high level. The first transfer circuit 31 may generate the first internal clock ICLK from the ground voltage VSS when the second mode setting signal OD is enabled to a logic high level. The first transfer circuit 31 may generate the first internal clock ICLK from the first divided clock ICLK_PRE when the third mode setting signal NOR is enabled to a logic high level.

The second transfer circuit 32 may generate the second internal clock QCLK from the first divided clock ICLK_PRE, the second divided clock QCLK_PRE, or the ground voltage VSS according to the first mode setting signal EV, the second mode setting signal OD, and the third mode setting signal NOR. The second transfer circuit 32 may generate the second internal clock QCLK from the ground voltage VSS when the first mode setting signal EV is enabled to a logic high level. The second transfer circuit 32 may generate the second internal clock QCLK from the first divided clock ICLK_PRE when the second mode setting signal OD is enabled to a logic high level. The second transfer circuit 32 may generate the second internal clock QCLK from the second divided clock QCLK_PRE when the third mode setting signal NOR is enabled to a logic high level.

The third transfer circuit 33 may generate the third internal clock IBCLK from the third divided clock IBCLK_PRE or the ground voltage VSS according to the first mode setting signal EV, the second mode setting signal OD and the third mode setting signal NOR. The third transfer circuit 33 may generate the third internal clock IBCLK from the third divided clock IBCLK_PRE when the first mode setting signal EV is enabled to a logic high level. The third transfer circuit 33 may generate the third internal clock IBCLK from the ground voltage VSS when the second mode setting signal OD is enabled to a logic high level. The third transfer circuit 33 may generate the third internal clock IBCLK from the third divided clock IBCLK_PRE when the third mode setting signal NOR is enabled to a logic high level.

The fourth transfer circuit 34 may generate the fourth internal clock QBCLK from the third divided clock IBCLK_PRE, the fourth divided clock QBCLK_PRE, or the ground voltage VSS according to the first mode setting signal EV, the second mode setting signal OD, and the third mode setting signal NOR. The fourth transfer circuit 34 may generate the fourth internal clock QBCLK from the ground voltage VSS when the first mode setting signal EV is enabled to a logic high level. The fourth transfer circuit 34 may generate the fourth internal clock QBCLK from the third divided clock IBCLK_PRE when the second mode setting signal OD is enabled to a logic high level. The fourth transfer circuit 34 may generate the fourth internal clock QBCLK from the fourth divided clock QBCLK_PRE when the third mode setting signal NOR is enabled to a logic high level.

Figure 7:
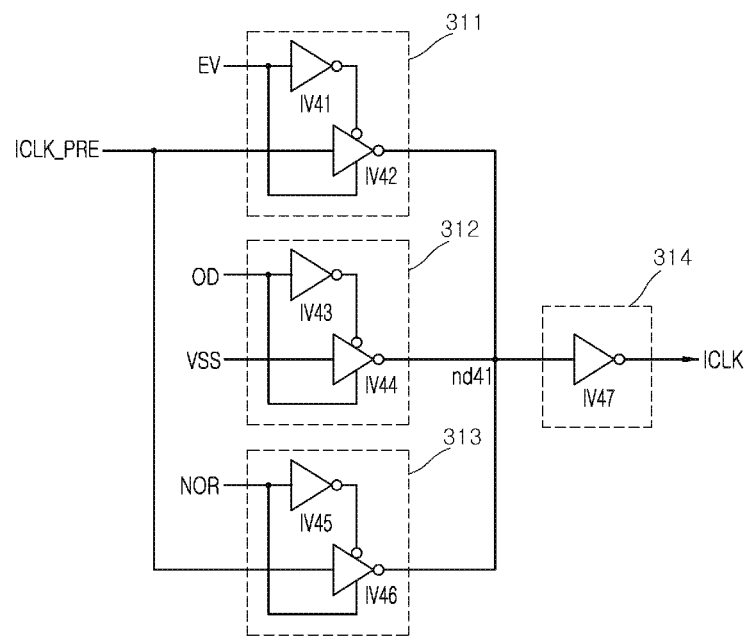
FIG. 7 is a circuit diagram illustrating a configuration of a first transfer circuit included in the internal clock generation circuit illustrated in FIG. 6.

Referring to FIG. 7, the first transfer circuit 31 may include a first internal transfer circuit 311, a second internal transfer circuit 312, a third internal transfer circuit 313, and a first internal clock output circuit 314.

The first internal transfer circuit 311 may include inverters IV41 and IV42. The first internal transfer circuit 311 may invert and buffer the first divided clock ICLK_PRE and output the inverted and buffered signal to a node nd41, when the first mode setting signal EV is enabled to a logic high level.

The second internal transfer circuit 312 may include inverters IV43 and IV44. The second internal transfer circuit 312 may invert and buffer the ground voltage VSS and output the inverted and buffered signal to the node nd41, when the second mode setting signal OD is enabled to a logic high level.

The third internal transfer circuit 313 may include inverters IV45 and IV46. The third internal transfer circuit 313 may invert and buffer the first divided clock ICLK_PRE and output the inverted and buffered signal to the node nd41, when the third mode setting signal NOR is enabled to a logic high level.

The first internal clock output circuit 314 may include an inverter IV47. The first internal clock output circuit 314 may invert and buffer the signal of the node nd41, and output the inverted and buffered signal as the first internal clock ICLK.

Figure 8:
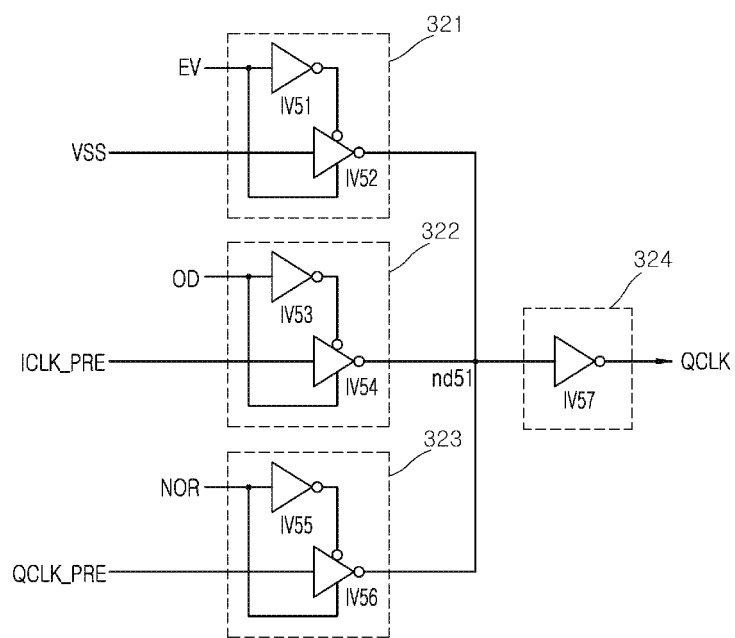
FIG. 8 is a circuit diagram illustrating a configuration of a second transfer circuit included in the internal clock generation circuit illustrated in FIG. 6.

Referring to FIG. 8, the second transfer circuit 32 may include a fourth internal transfer circuit 321, a fifth internal transfer circuit 322, a sixth internal transfer circuit 323, and a second internal clock output circuit 324.

The fourth internal transfer circuit 321 may include inverters IV51 and IV52. The fourth internal transfer circuit 321 may invert and buffer the ground voltage VSS and output the inverted and buffered signal to a node nd51, when the first mode setting signal EV is enabled to a logic high level.

The fifth internal transfer circuit 322 may include inverters IV53 and IV54. The fifth internal transfer circuit 322 may invert and buffer the first divided clock ICLK_PRE and output the inverted and buffered signal to the node nd51, when the second mode setting signal OD is enabled to a logic high level.

The sixth internal transfer circuit 323 may include inverters IV55 and IV56. The sixth internal transfer circuit 323 may invert and buffer the third divided clock QCLK_PRE and output the inverted and buffered signal to the node nd51, when the third mode setting signal NOR is enabled to a logic high level.

The second internal clock output circuit 324 may include an inverter IV57. The second internal clock output circuit 324 may invert and buffer the signal of the node nd51, and output the inverted and buffered signal as the second internal clock QCLK.

Figure 9:
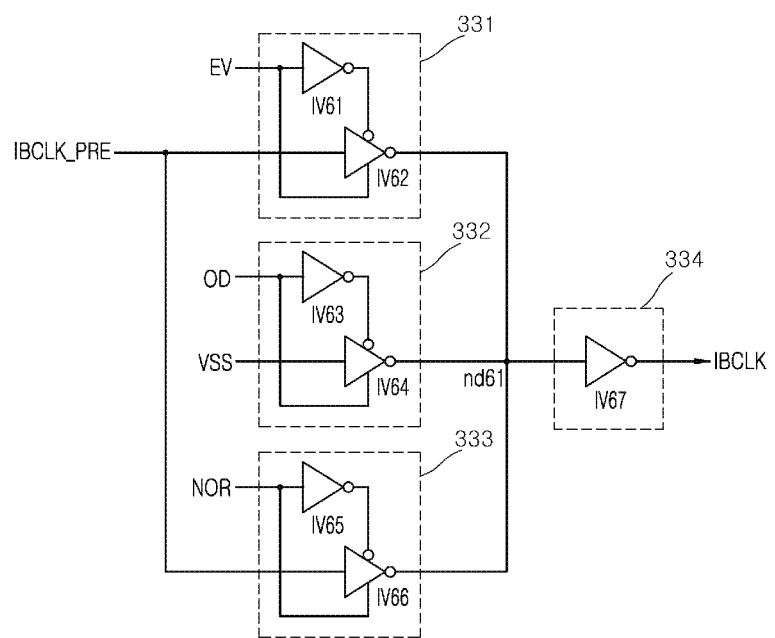
FIG. 9 is a circuit diagram illustrating a configuration of a third transfer circuit included in the internal clock generation circuit illustrated in FIG. 6.

Referring to FIG. 9, the third transfer circuit 33 may include a seventh internal transfer circuit 331, an eighth internal transfer circuit 332, a ninth internal transfer circuit 333, and a third internal clock output circuit 334.

The seventh internal transfer circuit 331 may include inverters IV61 and IV62. The seventh internal transfer circuit 331 may invert and buffer the third divided clock IBCLK_PRE and output the inverted and buffered signal to a node nd61, when the first mode setting signal EV is enabled to a logic high level.

The eighth internal transfer circuit 332 may include inverters IV63 and IV64. The eighth internal transfer circuit 332 may invert and buffer the ground voltage VSS and output the inverted and buffered signal to the node nd61, when the second mode setting signal OD is enabled to a logic high level.

The ninth internal transfer circuit 333 may include inverters IV65 and IV66. The ninth internal transfer circuit 333 may invert and buffer the third divided clock IBCLK_PRE and output the inverted and buffered signal to the node nd61, when the third mode setting signal NOR is enabled to a logic high level.

The third internal clock output circuit 334 may include an inverter IV67. The third internal clock output circuit 334 may invert and buffer the signal of the node nd61, and output the inverted and buffered signal as the third internal clock IBCLK.

Figure 10:
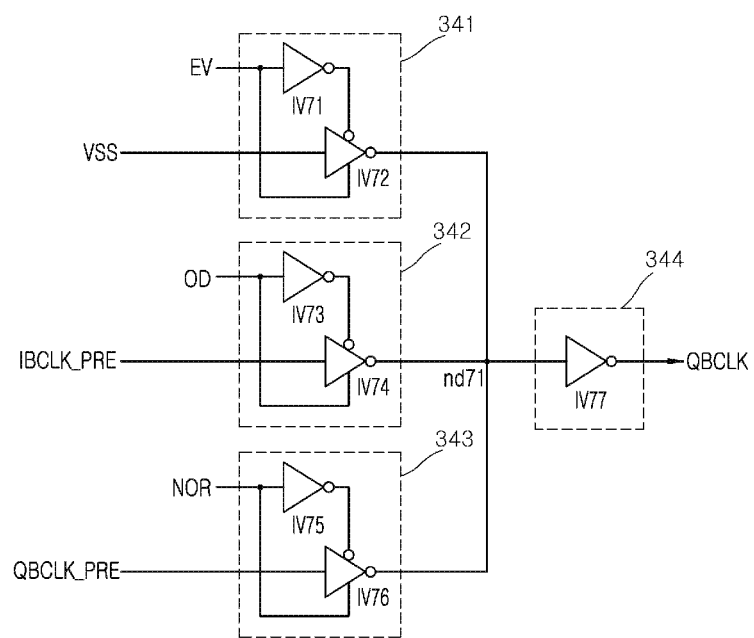
FIG. 10 is a circuit diagram illustrating a configuration of a fourth transfer circuit included in the internal clock generation circuit illustrated in FIG. 6.

Referring to FIG. 10, the fourth transfer circuit 34 may include a tenth internal transfer circuit 341, an 11th internal transfer circuit 342, a 12th internal transfer circuit 343, and a fourth internal clock output circuit 344.

The tenth internal transfer circuit 341 may include inverters IV71 and IV72. The tenth internal transfer circuit 341 may invert and buffer the ground voltage VSS and output the inverted and buffered signal to a node nd71, when the first mode setting signal EV is enabled to a logic high level.

The 11th internal transfer circuit 342 may include inverters IV73 and IV74. The 11th internal transfer circuit 342 may invert and buffer the third divided clock IBCLK_PRE and output the inverted and buffered signal to the node nd71, when the second mode setting signal OD is enabled to a logic high level.

The 12th internal transfer circuit 343 may include inverters IV75 and IV76. The 12th internal transfer circuit 343 may invert and buffer the fourth divided clock QBCLK_PRE and output the inverted and buffered signal to the node nd71, when the third mode setting signal NOR is enabled to a logic high level.

The fourth internal clock output circuit 344 may include an inverter IV77. The fourth internal clock output circuit 344 may invert and buffer the signal of the node nd71, and output the inverted and buffered signal as the fourth internal clock QBCLK.

Figure 11:
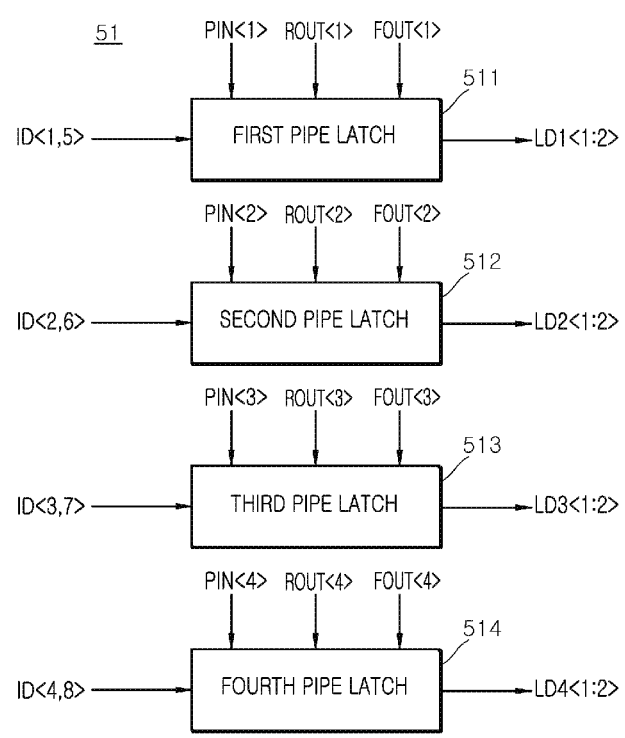
FIG. 11 is a block diagram illustrating a configuration of a pipe circuit included in the semiconductor device illustrated in FIG. 1.

Referring to FIG. 11, the pipe circuit 51 may include a first pipe latch 511, a second pipe latch 512, a third pipe latch 513, and a fourth pipe latch 514.

The first pipe latch 511 may latch the first bit ID<1> and the fifth bit ID<5> of the internal data according to the first input control signal PIN<1>. The first pipe latch 511 may generate the first latch data LD1<1:2> from the latched first and fifth bits ID<1,5> of the internal data according to the first rising output control signal ROUT<1>. The first pipe latch 511 may generate the first latch data LD1<1:2> from the latched first and fifth bits ID<1,5> of the internal data according to the first falling output control signal FOUT<1>.

The second pipe latch 512 may latch the second bit ID<2> and the sixth bit ID<6> of the internal data according to the second input control signal PIN<2>. The second pipe latch 512 may generate the second latch data LD2<1:2> from the latched second and sixth bits ID<2,6> of the internal data according to the second rising output control signal ROUT<2>. The second pipe latch 512 may generate the second latch data LD2<1:2> from the latched second and sixth bits ID<2,6> of the internal data according to the second falling output control signal FOUT<2>.

The third pipe latch 513 may latch the third bit ID<3> and the seventh bit ID<7> of the internal data according to the third input control signal PIN<3>. The third pipe latch 513 may generate the third latch data LD3<1:2> from the latched third and seventh bits ID<3,7> of the internal data according to the third rising output control signal ROUT<3>. The third pipe latch 513 may generate the third latch data LD3<1:2> from the latched third and seventh bits ID<3,7> of the internal data according to the third falling output control signal FOUT<3>.

The fourth pipe latch 514 may latch the fourth bit ID<4> and the eighth bit ID<8> of the internal data according to the fourth input control signal PIN<4>. The fourth pipe latch 514 may generate the fourth latch data LD4<1:2> from the latched fourth and eighth bits ID<4:8> of the internal data according to the fourth rising output control signal ROUT<4>. The fourth pipe latch 514 may generate the fourth latch data LD4<1:2> from the latched fourth and eighth bits ID<4:8> of the internal data according to the fourth falling output control signal FOUT<4>.

Figure 12:
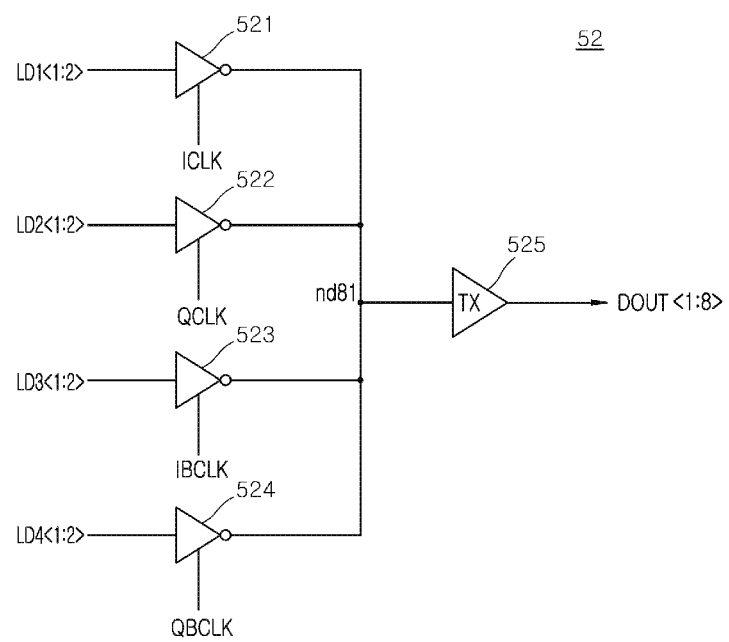
FIG. 12 is a block diagram illustrating a configuration of a data sorting circuit included in the semiconductor device illustrated in FIG. 1.

Referring to FIG. 12, the data sorting circuit 52 may include a first driver 521, a second driver 522, a third driver 523, a fourth driver 524, and a transmitter 525.

The first driver 521 may drive a node nd81 according to the logic level of the first latch data LD1<1:2> in synchronization with the first internal clock ICLK. The first driver 521 may drive the node nd81 according to the logic level of the first latch data LD1<1:2> during an interval in which the first internal clock ICLK is inputted at a logic high level.

The second driver 522 may drive the node nd81 according to the logic level of the second latch data LD2<1:2> in synchronization with the second internal clock QCLK. The second driver 522 may drive the node nd81 according to the logic level of the second latch data LD2<1:2> during an interval in which the second internal clock QCLK is inputted at a logic high level.

The third driver 523 may drive the node nd81 according to the logic level of the third latch data LD3<1:2> in synchronization with the third internal clock IBCLK. The third driver 523 may drive the node nd81 according to the logic level of the third latch data LD3<1:2> during an interval in which the third internal clock IQCLK is inputted at a logic high level.

The fourth driver 524 may drive the node nd81 according to the logic level of the fourth latch data LD4<1:2> in synchronization with the fourth internal clock QBCLK. The fourth driver 524 may drive the node nd81 according to the logic level of the fourth latch data LD4<1:2> during an interval in which the fourth internal clock QBCLK is inputted at a logic high level.

The transmitter 525 may drive the first to eighth output data DOUT<1:8> according to the logic level of the node nd81. The transmitter 525 may output the first to eighth output data DOUT<1:8>, driven according to the logic level of the node nd81, to the outside.

Figure 13:
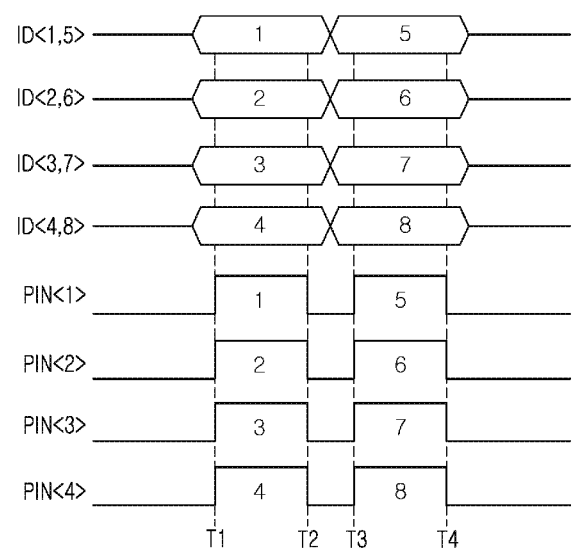
FIGS. 13 to 16 are timing diagrams for describing operations of a semiconductor device in accordance with an embodiment.
Figure 14:
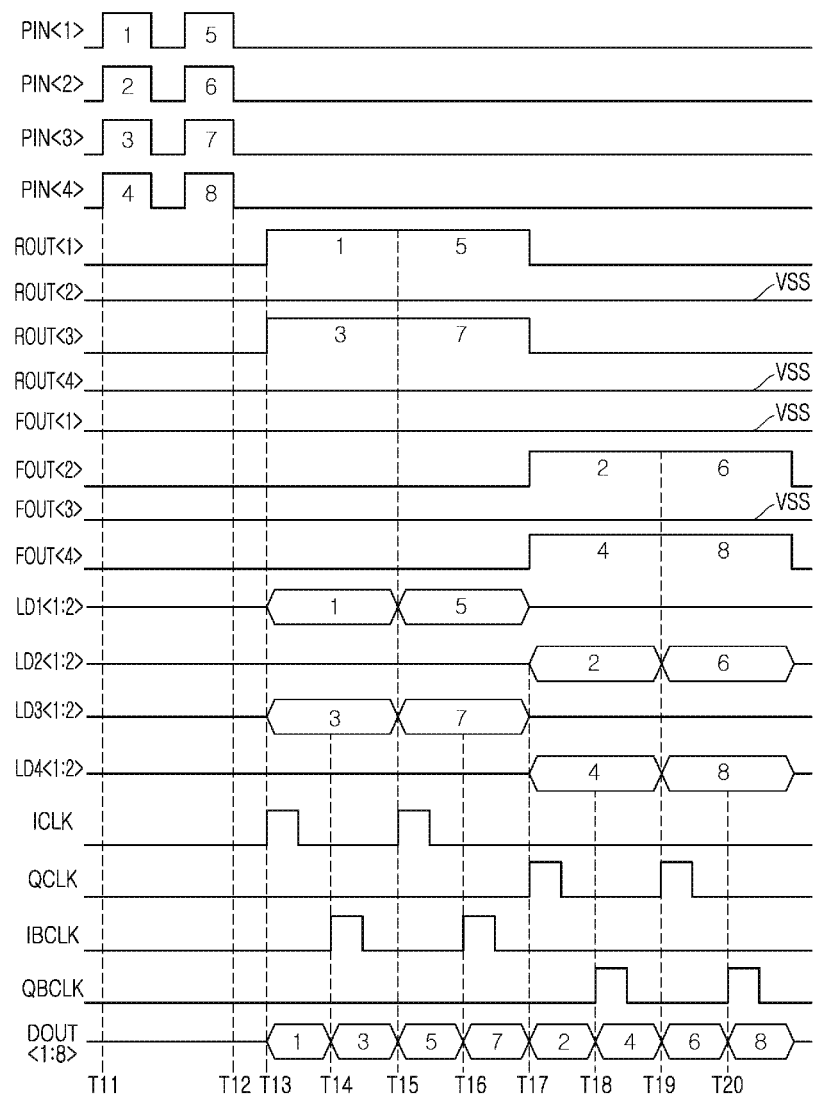

Referring to FIGS. 13 and 14, an operation of the semiconductor device 1 in accordance with the present embodiment will be described. During the operation, the second mode is successively performed after the first mode.

Before the operation is described, the mode setting circuit 10 generates the first mode setting signal EV which is enabled to a logic high level according to the high-level first mode signal MODE<1> and the low-level second mode signal MODE<2>, in order to enter the first mode.

The memory region 40 outputs the first to eighth bits ID<1:8> of the internal data stored therein.

Referring to FIG. 13, the input control signal generation circuit 21 of the pipe control circuit 20 generates first pulses of the first to fourth input control signals PIN<1:4> which are simultaneously enabled to a logic high level by the high-level first mode setting signal EV in synchronization with the rising clock RCLK and the falling clock FCLK, from time T1 to time T2.

The pipe circuit 51 of the data processing circuit 50 latches the first to eighth bits ID<1:8> of the internal data according to the first to fourth input control signals PIN<1:4>.

At this time, the pipe circuit 51 of the data processing circuit 50 stores the first bit ID<1>, the second bit ID<2>, the third bit ID<3>, and the fourth bit ID<4> of the internal data.

The input control signal generation circuit 21 of the pipe control circuit 20 generates second pulses of the first to fourth input control signals PIN<1:4> which are simultaneously enabled to a logic high level by the high-level first mode setting signal EV in synchronization with the rising clock RCLK and the falling clock FCLK, from time T3 to time T4.

The pipe circuit 51 of the data processing circuit 50 latches the first to eighth bits ID<1:8> of the internal data according to the first to fourth input control signals PIN<1:4>.

At this time, the pipe circuit 51 of the data processing circuit 50 stores the fifth bit ID<5>, the sixth bit ID<6>, the seventh bit ID<7>, and the eighth bit ID<8> of the internal data.

Time T11 in FIG. 14 is set to the same time as time T1 in FIG. 13, and time T12 in FIG. 14 is set to the same time as time T4 in FIG. 13.

Referring to FIG. 14, the output control signal generation circuit 22 generates the high-level first and third rising output control signals ROUT<1,3> from the rising clock RCLK according to the high-level first mode setting signal EV at time T13. At this time, the output control signal generation circuit 22 generates the low-level second and fourth rising output control signals ROUT<2,4> from the ground voltage VSS according to the high-level first mode setting signal EV.

The pipe circuit 51 outputs the latched first and third bits ID<1:3> of the internal data as the first bit LD1<1> of the first latch data and the first bit LD3<1> of the third latch data, according to the high-level first and third rising output control signals ROUT<1,3>.

The internal clock generation circuit 30 generates a first pulse of the first internal clock ICLK from the first divided clock ICLK_PRE according to the high-level first mode setting signal EV.

The data sorting circuit 52 generates the first output data DOUT<1> from the first bit LD1<1> of the first latch data in synchronization with the first internal clock ICLK. The first output data DOUT<1> is generated from the first bit ID<1> of the internal data.

At time T14, the internal clock generation circuit 30 generates a first pulse of the third internal clock IBCLK from the third divided clock IBCLK_PRE according to the high-level first mode setting signal EV.

The data sorting circuit 52 generates the second output data DOUT<2> from the first bit LD3<1> of the third latch data in synchronization with the third internal clock IBCLK. The second output data DOUT<2> is generated from the third bit ID<3> of the internal data.

At time T15, the pipe circuit 51 outputs the latched fifth and seventh bits ID<5,7> of the internal data as the second bit LD1<2> of the first latch data and the second bit LD3<2> of the third latch data, according to the high-level first and third rising output control signals ROUT<1,3>.

The internal clock generation circuit 30 generates a second pulse of the first internal clock ICLK from the first divided clock ICLK_PRE according to the high-level first mode setting signal EV.

The data sorting circuit 52 generates the third output data DOUT<3> from the second bit LD1<2> of the first latch data in synchronization with the first internal clock ICLK. The third output data DOUT<3> is generated from the fifth bit ID<5> of the internal data.

At time T16, the internal clock generation circuit 30 generates a second pulse of the third internal clock IBCLK from the third divided clock IBCLK_PRE according to the high-level first mode setting signal EV.

The data sorting circuit 52 generates the fourth output data DOUT<4> from the second bit LD3<2> of the third latch data in synchronization with the third internal clock IBCLK. The fourth output data DOUT<4> is generated from the seventh bit ID<7> of the internal data.

At time T17, the mode setting circuit 10 generates the second mode setting signal OD which is enabled to a logic high level according to the low-level first mode signal MODE<1> and the high-level second mode signal MODE<2>, in order to enter the second mode.

The output control signal generation circuit 22 generates the high-level second and fourth falling output control signals FOUT<2,4> from the falling clock FCLK according to the high-level second mode setting signal OD. At this time, the output control signal generation circuit 22 generates the low-level first and third falling output control signals FOUT<1,3> from the ground voltage VSS according to the high-level second mode setting signal OD.

The pipe circuit 51 outputs the latched second and fourth bits ID<2,4> of the internal data as the first bit LD2<1> of the second latch data and the first bit LD4<1> of the fourth latch data, according to the high-level second and fourth falling output control signals FOUT<2,4>.

The internal clock generation circuit 30 generates a first pulse of the second internal clock QCLK from the first divided clock ICLK_PRE according to the high-level second mode setting signal OD.

The data sorting circuit 52 generates the fifth output data DOUT<5> from the first bit LD2<1> of the second latch data in synchronization with the second internal clock QCLK. The fifth output data DOUT<5> is generated from the second bit ID<2> of the internal data.

At time T18, the internal clock generation circuit 30 generates a first pulse of the fourth internal clock QBCLK from the third divided clock IBCLK_PRE according to the high-level second mode setting signal OD.

The data sorting circuit 52 generates the sixth output data DOUT<6> from the first bit LD4<1> of the fourth latch data in synchronization with the fourth internal clock QBCLK. The sixth output data DOUT<6> is generated from the fourth bit ID<4> of the internal data.

At time T19, the pipe circuit 51 outputs the latched sixth and eighth bits ID<6,8> of the internal data as the second bit LD2<2> of the second latch data and the second bit LD4<2> of the fourth latch data, according to the high-level second and fourth falling output control signals FOUT<2,4>.

The internal clock generation circuit 30 generates a second pulse of the second internal clock QCLK from the first divided clock ICLK_PRE according to the high-level second mode setting signal OD.

The data sorting circuit 52 generates the seventh output data DOUT<7> from the second bit LD2<2> of the second latch data in synchronization with the second internal clock QCLK. The seventh output data DOUT<7> is generated from the sixth bit ID<6> of the internal data.

At time T20, the internal clock generation circuit 30 generates a second pulse of the fourth internal clock QBCLK from the third divided clock IBCLK_PRE according to the high-level second mode setting signal OD.

The data sorting circuit 52 generates the eighth output data DOUT<8> from the second bit LD4<2> of the fourth latch data in synchronization with the fourth internal clock QBCLK. The eighth output data DOUT<8> is generated from the eighth bit ID<8> of the internal data.

Figure 15:
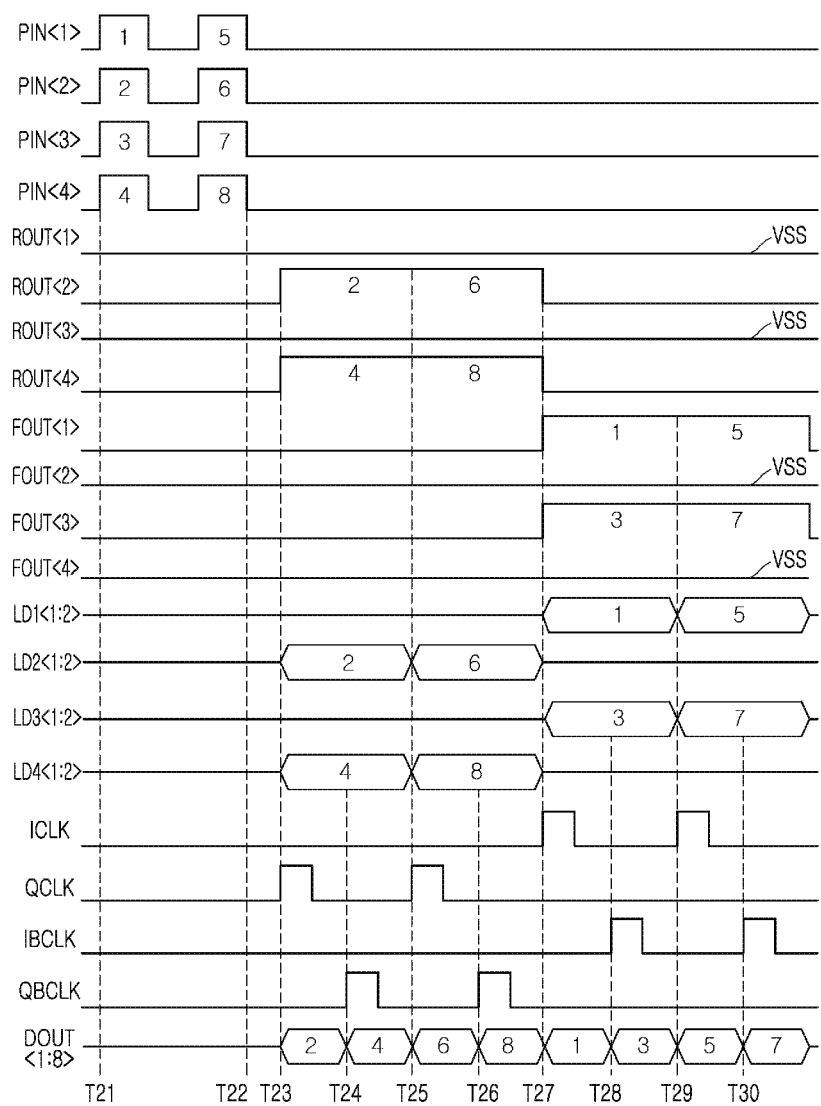

Referring to FIGS. 13 and 15, an operation of the semiconductor device 1 in accordance with the present embodiment will be described. During the operation, the first mode is successively performed after the second mode.

Before the operation is described, the mode setting circuit 10 generates the second mode setting signal OD which is enabled to a logic high level according to the low-level first mode signal MODE<1> and the high-level second mode signal MODE<2>, in order to enter the second mode.

The memory region 40 outputs the first to eighth bits ID<1:8> of the internal data stored therein.

Referring to FIG. 13, the input control signal generation circuit 21 of the pipe control circuit 20 generates the first pulses of the first to fourth input control signals PIN<1:4>, which are simultaneously enabled to a logic high level by the high-level first mode setting signal EV in synchronization with the rising clock RCLK and the falling clock FCLK, from time T1 to time T2.

The pipe circuit 51 of the data processing circuit 50 latches the first to eighth bits ID<1:8> of the internal data according to the first to fourth input control signals PIN<1:4>.

At this time, the pipe circuit 51 of the data processing circuit 50 stores the first bit ID<1>, the second bit ID<2>, the third bit ID<3>, and the fourth bit ID<4> of the internal data.

The input control signal generation circuit 21 of the pipe control circuit 20 generates the second pulses of the first to fourth input control signals PIN<1:4>, which are simultaneously enabled to a logic high level by the high-level second mode setting signal OD in synchronization with the rising clock RCLK and the falling clock FCLK, from time T3 to time T4.

The pipe circuit 51 of the data processing circuit 50 latches the first to eighth bits ID<1:8> of the internal data according to the first to fourth input control signals PIN<1:4>.

At this time, the pipe circuit 51 of the data processing circuit 50 stores the fifth bit ID<5>, the sixth bit ID<6>, the seventh bit ID<7>, and the eighth bit ID<8> of the internal data.

Time T21 in FIG. 15 is set to the same time as time T1 in FIG. 13, and time T22 in FIG. 15 is set to the same time as time T4 in FIG. 13.

Referring to FIG. 15, the output control signal generation circuit 22 generates the high-level second and fourth rising output control signals ROUT<2,4> from the rising clock RCLK according to the high-level second mode setting signal OD, at time T23. At this time, the output control signal generation circuit 22 generates the low-level first and third rising output control signals ROUT<1,3> from the ground voltage VSS according to the high-level second mode setting signal OD.

The pipe circuit 51 outputs the latched second and fourth bits ID<2,4> of the internal data as the first bit LD2<1> of the second latch data and the first bit LD4<1> of the fourth latch data, according to the high-level second and fourth rising output control signals ROUT<2,4>.

The internal clock generation circuit 30 generates a first pulse of the second internal clock QCLK from the first divided clock ICLK_PRE according to the high-level second mode setting signal OD.

The data sorting circuit 52 generates the first output data DOUT<1> from the first bit LD2<1> of the second latch data in synchronization with the second internal clock QCLK. The first output data DOUT<1> is generated from the second bit ID<2> of the internal data.

At time T24, the internal clock generation circuit 30 generates a first pulse of the fourth internal clock QBCLK from the third divided clock IBCLK_PRE according to the high-level second mode setting signal OD.

The data sorting circuit 52 generates the second output data DOUT<2> from the first bit LD4<1> of the fourth latch data in synchronization with the fourth internal clock QBCLK. The second output data DOUT<2> is generated from the fourth bit ID<4> of the internal data.

At time T25, the pipe circuit 51 outputs the latched sixth and eighth bits ID<6,8> of the internal data as the second bit LD2<2> of the second latch data and the second bit LD4<2> of the fourth latch data, according to the high-level second and fourth rising output control signals ROUT<2,4>.

The internal clock generation circuit 30 generates a second pulse of the second internal clock QCLK from the first divided clock ICLK_PRE according to the high-level second mode setting signal OD.

The data sorting circuit 52 generates the third output data DOUT<3> from the second bit LD2<2> of the second latch data in synchronization with the second internal clock QCLK. The third output data DOUT<3> is generated from the sixth bit ID<6> of the internal data.

At time T26, the internal clock generation circuit 30 generates a second pulse of the fourth internal clock QBCLK from the third divided clock IBCLK_PRE according to the high-level second mode setting signal OD.

The data sorting circuit 52 generates the fourth output data DOUT<4> from the second bit LD4<2> of the fourth latch data in synchronization with the fourth internal clock QBCLK. The fourth output data DOUT<4> is generated from the eighth bit ID<8> of the internal data.

At time T27, the mode setting circuit 10 generates the first mode setting signal EV which is enabled to a logic high level according to the high-level first mode signal MODE<1> and the low-level second mode signal MODE<2>, in order to enter the first mode.

The output control signal generation circuit 22 generates the high-level first and third falling output control signals FOUT<1,3> from the falling clock FCLK according to the high-level first mode setting signal EV. At this time, the output control signal generation circuit 22 generates the low-level second and fourth falling output control signals FOUT<2,4> from the ground voltage VSS according to the high-level first mode setting signal EV.

The pipe circuit 51 outputs the latched first and third bits ID<1,3> of the internal data as the first bit LD1<1> of the first latch data and the first bit LD3<1> of the third latch data, according to the high-level first and third falling output control signals FOUT<1,3>.

The internal clock generation circuit 30 generates a first pulse of the first internal clock ICLK from the first divided clock ICLK_PRE according to the high-level first mode setting signal EV.

The data sorting circuit 52 generates the fifth output data DOUT<5> from the first bit LD1<1> of the first latch data in synchronization with the first internal clock ICLK. The fifth output data DOUT<5> is generated from the first bit ID<1> of the internal data.

At time T28, the internal clock generation circuit 30 generates a first pulse of the third internal clock IBCLK from the third divided clock IBCLK_PRE according to the high-level first mode setting signal EV.

The data sorting circuit 52 generates the sixth output data DOUT<6> from the first bit LD3<1> of the third latch data in synchronization with the third internal clock IBCLK. The sixth output data DOUT<6> is generated from the third bit ID<3> of the internal data.

At time T29, the pipe circuit 51 outputs the latched fifth and seventh bits ID<5,7> of the internal data as the second bit LD1<2> of the first latch data and the second bit LD3<2> of the third latch data, according to the high-level first and third falling output control signals FOUT<1,3>.

The internal clock generation circuit 30 generates a second pulse of the first internal clock ICLK from the first divided clock ICLK_PRE according to the high-level first mode setting signal EV.

The data sorting circuit 52 generates the seventh output data DOUT<7> from the second bit LD1<2> of the first latch data in synchronization with the first internal clock ICLK. The seventh output data DOUT<7> is generated from the fifth bit ID<5> of the internal data.

At time T30, the internal clock generation circuit 30 generates a second pulse of the third internal clock IBCLK from the third divided clock IBCLK_PRE according to the high-level first mode setting signal EV.

The data sorting circuit 52 generates the eighth output data DOUT<8> from the second bit LD3<2> of the third latch data in synchronization with the third internal clock IBCLK. The eighth output data DOUT<8> is generated from the seventh bit ID<7> of the internal data.

Figure 16:
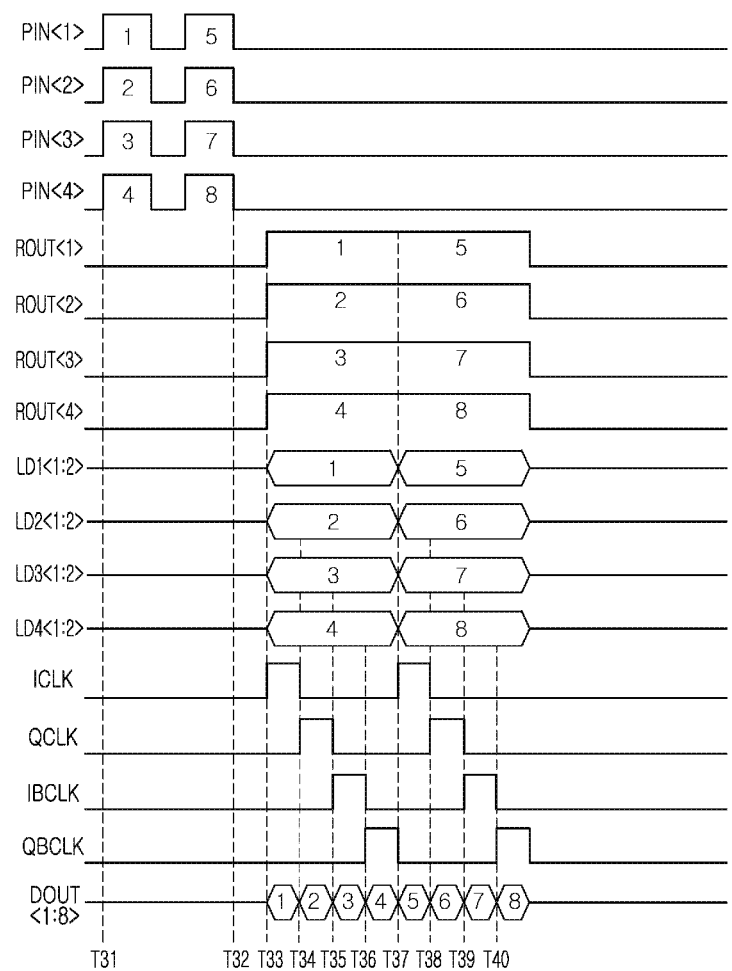

Referring to FIGS. 13 and 16, an operation of the semiconductor device 1 in accordance with the present embodiment will be described. During the operation, the third mode is performed.

Before the operation is described, the mode setting circuit 10 generates the third mode setting signal NOR which is enabled to a logic high level according to the low-level first mode signal MODE<1> and the low-level second mode signal MODE<2>, in order to enter the third mode.

The memory region 40 may output the first to eighth bits ID<1:8> of the internal data stored therein.

Referring to FIG. 13, the input control signal generation circuit 21 of the pipe control circuit 20 generates the first pulses of the first to fourth input control signals PIN<1:4> which are simultaneously enabled to a logic high level by the high-level third mode setting signal NOR in synchronization with the rising clock RCLK and the falling clock FCLK, from time T1 to time T2.

The pipe circuit 51 of the data processing circuit 50 latches the first to eighth bits ID<1:8> of the internal data according to the first to fourth input control signals PIN<1:4>.

At this time, the pipe circuit 51 of the data processing circuit 50 stores the first bit ID<1>, the second bit ID<2>, the third bit ID<3>, and the fourth bit ID<4> of the internal data.

The input control signal generation circuit 21 of the pipe control circuit 20 generates the second pulses of the first to fourth input control signals PIN<1:4> which are simultaneously enabled to a logic high level by the high-level third mode setting signal NOR in synchronization with the rising clock RCLK and the falling clock FCLK, from time T3 to time T4.

The pipe circuit 51 of the data processing circuit 50 latches the first to eighth bits ID<1:8> of the internal data according to the first to fourth input control signals PIN<1:4>.

At this time, the pipe circuit 51 of the data processing circuit 50 stores the fifth bit ID<5>, the sixth bit ID<6>, the seventh bit ID<7>, and the eighth bit ID<8> of the internal data.

Time T31 in FIG. 16 is set to the same time as time T1 in FIG. 13, and time T32 in FIG. 16 is set to the same time as time T4 in FIG. 13.

Referring to FIG. 16, the output control signal generation circuit 22 generates the high-level first to fourth rising output control signals ROUT<1:4> from the rising clock RCLK according to the high-level third mode setting signal NOR at time T33.

The pipe circuit 51 outputs the latched first to fourth bits ID<1:4> of the internal data as the first LD1<1> of the first latch data, the first bit LD2<1> of the second latch data, the first bit LD3<1> of the third latch data and the first bit LD4<1> of the fourth latch data, according to the high-level first to fourth rising output control signals ROUT<1:4>.

The internal clock generation circuit 30 generates a first pulse of the first internal clock ICLK from the first divided clock ICLK_PRE according to the high-level third mode setting signal NOR.

The data sorting circuit 52 generates the first output data DOUT<1> from the first bit LD1<1> of the first latch data in synchronization with the first internal clock ICLK. The first output data DOUT<1> is generated from the first bit ID<1> of the internal data.

At time T34, the internal clock generation circuit 30 generates a first pulse of the second internal clock QCLK from the second divided clock QCLK_PRE according to the high-level third mode setting signal NOR.

The data sorting circuit 52 generates the second output data DOUT<2> from the first bit LD2<1> of the second latch data in synchronization with the second internal clock QCLK. The second output data DOUT<2> is generated from the second bit ID<2> of the internal data.

At time T35, the internal clock generation circuit 30 generates a first pulse of the third internal clock IBCLK from the third divided clock IBCLK_PRE according to the high-level third mode setting signal NOR.

The data sorting circuit 52 generates the third output data DOUT<3> from the first bit LD3<1> of the third latch data in synchronization with the third internal clock IBCLK. The third output data DOUT<3> is generated from the third bit ID<3> of the internal data.

At time T36, the internal clock generation circuit 30 generates a first pulse of the fourth internal clock QBCLK from the fourth divided clock QBCLK_PRE according to the high-level third mode setting signal NOR.

The data sorting circuit 52 generates the fourth output data DOUT<4> from the first bit LD4<1> of the fourth latch data in synchronization with the fourth internal clock QBCLK. The fourth output data DOUT<4> is generated from the fourth bit ID<4> of the internal data.

At time T37, the output control signal generation circuit 22 generates the high-level first to fourth rising output control signals ROUT<1:4> from the rising clock RCLK according to the high-level third mode setting signal NOR.

The pipe circuit 51 outputs the latched fifth to eighth bits ID<5:8> of the internal data as the second LD1<2> of the first latch data, the second bit LD2<2> of the second latch data, the second bit LD3<2> of the third latch data and the second bit LD4<2> of the fourth latch data, according to the high-level first to fourth rising output control signals ROUT<1:4>.

The internal clock generation circuit 30 generates a second pulse of the first internal clock ICLK from the first divided clock ICLK_PRE according to the high-level third mode setting signal NOR.

The data sorting circuit 52 generates the fifth output data DOUT<5> from the second bit LD1<2> of the first latch data in synchronization with the first internal clock ICLK. The fifth output data DOUT<5> is generated from the fifth bit ID<5> of the internal data.

At time T38, the internal clock generation circuit 30 generates a second pulse of the second internal clock QCLK from the second divided clock QCLK_PRE according to the high-level third mode setting signal NOR.

The data sorting circuit 52 generates the sixth output data DOUT<6> from the second bit LD2<2> of the second latch data in synchronization with the second internal clock QCLK. The sixth output data DOUT<6> is generated from the sixth bit ID<6> of the internal data.

At time T39, the internal clock generation circuit 30 generates a second pulse of the third internal clock IBCLK from the third divided clock IBCLK_PRE according to the high-level third mode setting signal NOR.

The data sorting circuit 52 generates the seventh output data DOUT<7> from the second bit LD3<2> of the third latch data in synchronization with the third internal clock IBCLK. The seventh output data DOUT<7> is generated from the seventh bit ID<7> of the internal data.

At time T40, the internal clock generation circuit 30 generates a second pulse of the fourth internal clock QBCLK from the fourth divided clock QBCLK_PRE according to the high-level third mode setting signal NOR.

The data sorting circuit 52 generates the eighth output data DOUT<8> from the second bit LD4<2> of the fourth latch data in synchronization with the fourth internal clock QBCLK. The eighth output data DOUT<8> is generated from the eighth bit ID<8> of the internal data.

The semiconductor device in accordance with the present embodiment may selectively generate the plurality of internal clocks for determining the input/output order of data from the plurality of divided clocks and the ground voltage according to the operation mode, and determine the input/output order of the data in synchronization with the selectively generated internal clocks, thereby outputting the data at high speed. Furthermore, the semiconductor device in accordance with the present embodiment may determine the input/output order of data in synchronization with the plurality of internal clocks which are selectively generated according to the operation mode, and does not require a separate circuit for changing the data input/output order, which makes it possible to reduce the area.

The semiconductor device described with reference to FIGS. 1 to 16 may be applied to an electronic system including a memory system, a graphic system, a computing system, a mobile system and the like. For example, referring to FIG. 17, an electronic system 1000 in accordance with an embodiment may include a data storage unit 1001, a memory controller 1002, a buffer memory 1003 and an input/output interface 1004.

According to a control signal from the memory controller 1002, the data storage unit 1001 stores data applied from the memory controller 1002, reads the stored data, and outputs the read data to the memory controller 1002. The data storage unit 1001 may include the semiconductor device 1 illustrated in FIG. 1. The data storage unit 1001 may include a nonvolatile memory capable of continuously retaining data stored therein even though power is removed. The nonvolatile memory may be implemented as a flash memory (NOR flash memory or NAND flash memory), PRAM (Phase Change Random Access Memory), RRAM (Resistive Random Access Memory), STTRAM (Spin Transfer Torque Random Access Memory), or MRAM (Magnetic Random Access Memory).

Figure 17:
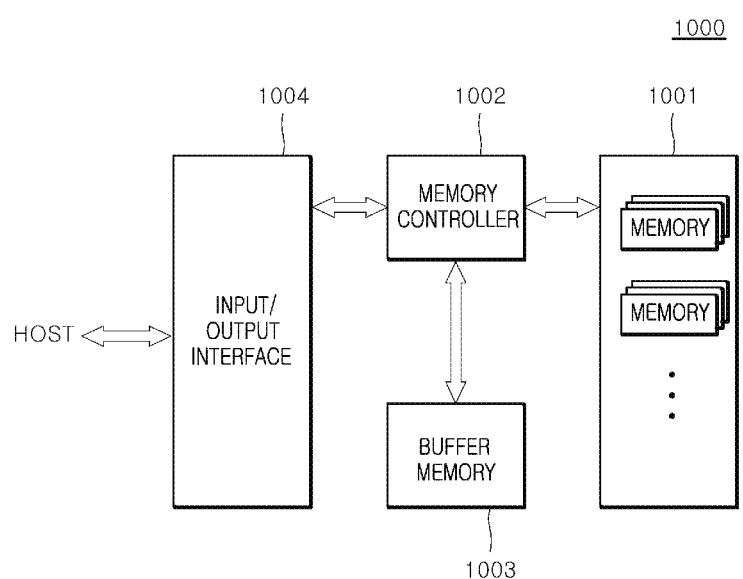
FIG. 17 is a diagram illustrating a configuration of an electronic system, in accordance with an embodiment, to which the semiconductor device illustrated in FIGS. 1 to 16 is applied.

The memory controller 1002 decodes a command applied from an external device (host device) through the input/output interface 1004, and controls data input/output for the data storage unit 1001 and the buffer memory 1003 according to the decoding result. FIG. 17 illustrates the memory controller 1002 as one block. However, the memory controller 1002 may include a controller for controlling a nonvolatile memory and a controller for controlling a volatile memory serving as the buffer memory 1003, which are independently configured.

The buffer memory 1003 may temporarily store data to be processed by the memory controller 1002, i.e. data inputted to/outputted from the data storage unit 1001. The buffer memory 1003 may store data applied from the memory controller 1002 according to a control signal. The buffer memory 1003 reads the data stored therein and outputs the read data to the memory controller 1002. The buffer memory 1003 may include a volatile memory such as DRAM (Dynamic Random Access Memory), mobile DRAM and SRAM (Static Random Access Memory).

The input/output interface 1004 may provide a physical connection between the memory controller 1002 and an external device (host device), such that the memory controller 1002 can receive the control signal for data input/output from the external device and exchange data with the external device. The input/output interface 1004 may include one of various interface protocols such as USB, MMC, PCI-E, SAS, SATA, PATA, SCSI, ESDI, and IDE.

The electronic system 1000 may be used as a secondary memory device or external storage device of the host device. The electronic system 1000 may include an SSD (Solid State Disk), a USB (Universal Serial Bus) memory, an SD (Secure Digital) card, an mSD (mini Secure Digital) card, a micro SD card, an SDHC (Secure Digital High Capacity) card, a memory stick card, an SM (Smart Media) card, an MMC (Multi-Media Card), an eMMC (embedded MMC), a CF (Compact Flash) card, and the like.

Although preferred embodiments of the disclosure have been disclosed for illustrative purposes, those skilled in the art will appreciate that various modifications, additions, and/or substitutions are possible, without departing from the scope and spirit of the disclosure as defined in the accompanying claims. Thus, the true technical scope of the disclosure should be defined by the following claims.

What is claimed is:

1. A semiconductor device comprising:
    an internal clock generation circuit configured to generate a first internal clock, a second internal clock, a third internal clock, and a fourth internal clock from a first divided clock, a third divided clock, and a ground voltage in a first mode and a second mode; and a data processing circuit configured to:
latch first internal data, second internal data, third internal data, and fourth internal data according to a first input control signal, a second input control signal, a third input control signal, and a fourth input control signal; and
generate first output data, second output data, third output data, and fourth output data by determining the output priority of the latched first and third internal data and the latched second and fourth internal data according to the first to fourth internal clocks, a first rising output control signal, a second rising output control signal, a third rising output control signal, a fourth rising output control signal, a first falling output control signal, a second falling output control signal, a third falling output control signal, and a fourth falling output control signal.

2. The semiconductor device of claim 1, wherein the internal clock generation circuit is configured to generate the first and third internal clocks from the ground voltage in the second mode, and configured to generate the second and fourth internal clocks from the ground voltage in the first mode.

3. The semiconductor device of claim 1, wherein the internal clock generation circuit is configured to generate, in the first mode, the first and third internal clocks from the first and third divided clocks and the ground voltage and then to generate the second and fourth internal clocks,
wherein the internal clock generation circuit is configured to generate, in the second mode, the second and fourth internal clocks from the second and fourth divided clocks and the ground voltage and then to generate the first and third internal clocks.

4. The semiconductor device of claim 1, wherein the data processing circuit is configured to generate, in the first mode, the first and second output data from the first and third internal data and to then generate the third and fourth output data from the second and fourth internal data,
wherein the data processing circuit is configured to generate, in the second mode, the first and second output data from the second and fourth internal data and then to generate the third and fourth output data from the first and third internal data.

5. The semiconductor device of claim 1, wherein the internal clock generation circuit comprises:
a first transfer circuit configured to generate the first internal clock from the first divided clock in the first mode and generate the first internal clock from the ground voltage in the second mode;
a second transfer circuit configured to generate the second internal clock from the ground voltage in the first mode and generate the second internal clock from the first divided clock in the second mode;
a third transfer circuit configured to generate the third internal clock from the third divided clock in the first mode and generate the third internal clock from the ground voltage in the second mode; and
a fourth transfer circuit configured to generate the fourth internal clock from the ground voltage in the first mode and generate the fourth internal clock from the third divided clock in the second mode.

6. The semiconductor device of claim 5, wherein the first transfer circuit comprises:

a first internal transfer circuit configured to invert and buffer the first divided clock and output the inverted and buffered signal to a first node, in the first mode;
a second internal transfer circuit configured to invert and buffer the ground voltage and output the inverted and buffered signal to the first node, in the second mode; and
a first internal clock output circuit configured to invert and buffer the signal of the first node and output the inverted and buffered signal as the first internal clock.

7. The semiconductor device of claim 5, wherein the second transfer circuit comprises:
a third internal transfer circuit configured to invert and buffer the ground voltage and output the inverted and buffered signal to a second node, in the first mode;
a fourth internal transfer circuit configured to invert and buffer the first divided clock and output the inverted and buffered signal to the second node, in the second mode; and
a second internal clock output circuit configured to invert and buffer the signal of the second node and output the inverted and buffered signal as the second internal clock.

8. The semiconductor device of claim 5, wherein the third transfer circuit comprises:
a fifth internal transfer circuit configured to invert and buffer the third divided clock and output the inverted and buffered signal to a third node, in the first mode;
a sixth internal transfer circuit configured to invert and buffer the ground voltage and output the inverted and buffered signal to the third node, in the second mode; and
a third internal clock output circuit configured to invert and buffer the signal of the third node and output the inverted and buffered signal as the third internal clock.

9. The semiconductor device of claim 5, wherein the fourth transfer circuit comprises:
a seventh internal transfer circuit configured to invert and buffer the ground voltage and output the inverted and buffered signal to a fourth node, in the first mode;
an eighth internal transfer circuit configured to invert and buffer the third divided clock and output the inverted and buffered signal to the fourth node, in the second mode; and
a fourth internal clock output circuit configured to invert and buffer the signal of the fourth node and output the inverted and buffered signal as the fourth internal clock.

10. The semiconductor device of claim 1, wherein the data processing circuit comprises:
a pipe circuit configured to latch the first to fourth internal data according to the first to fourth input control signals, and output the latched first to fourth internal data as first to fourth latch data according to the first to fourth rising output control signals and the first to fourth falling output control signals; and
a data sorting circuit configured to generate the first to fourth output data from the first to fourth latch data in synchronization with the first to fourth internal clocks.

11. The semiconductor device of claim 10, wherein the pipe circuit comprises:
a first pipe latch configured to latch the first internal data according to the first input control signal, and generate the first latch data from the latched first internal data according to one of the first rising output control signal and the first falling output control signal;
a second pipe latch configured to latch the second internal data according to the second input control signal, and generate the second latch data from the latched second internal data according to one of the second rising output control signal and the second falling output control signal;

a third pipe latch configured to latch the third internal data according to the third input control signal, and generate the third latch data from the latched third internal data according to one of the third rising output control signal and the third falling output control signal; and a fourth pipe latch configured to latch the fourth internal data according to the fourth input control signal, and generate the fourth latch data from the latched fourth internal data according to one of the fourth rising output control signal and the fourth falling output control signal.

12. The semiconductor device of claim 10, wherein the data sorting circuit comprises:

a first driver configured to drive a fifth node according to the logic level of the first latch data in synchronization with the first internal clock;

a second driver configured to drive the fifth node according to the logic level of the second latch data in synchronization with the second internal clock;

a third driver configured to drive the fifth node according to the logic level of the third latch data in synchronization with the third internal clock;

a fourth driver configured to drive the fifth node according to the logic level of the fourth latch data in synchronization with the fourth internal clock; and a transmitter configured to drive the first to fourth output data according to the logic level of the fifth node and output the first to fourth output data to the outside.

13. A semiconductor device comprising:

a mode setting circuit configured to generate a first mode setting signal, a second mode setting signal, and a third mode setting signal according to a combination of a first mode signal and a second mode signal;

an internal clock generation circuit configured to generate a first internal clock, a second internal clock, a third internal clock, and a fourth internal clock from a first divided clock, a second divided clock, a third divided clock, a fourth divided clock, and a ground voltage according to the first to third mode setting signals; and a data processing circuit configured to:
latch first internal data, second internal data, third internal data, and fourth internal data according to a first input control signal, a second input control signal, a third input control signal, and a fourth input control signal; and generate first output data, second output data, third output data, and fourth output data by determining the output priority of the latched first and third internal data and the latched second and fourth internal data according to the first to fourth internal clocks, a first rising output control signal, a second rising output control signal, a third rising output control signal, a fourth rising output control signal, a first falling output control signal, a second falling output control signal, a third falling output control signal, and a fourth falling output control signal.

14. The semiconductor device of claim 13, wherein each of the first to fourth divided clocks comprises at least one pulse, and the first to fourth divided clocks have different phases.

15. The semiconductor device of claim 13, wherein the internal clock generation circuit is configured to:

enter a first mode according to the first mode setting signal, generate the first and third internal clocks from the first and third divided clocks and the ground voltage, and then generate the second and fourth internal clocks;

enter a second mode according to the second mode setting signal, generate the second and fourth internal clocks from the second and fourth divided clocks and the ground voltage, and then generate the first and third internal clocks; and enter a third mode according to the third mode setting signal and generate the first to fourth internal clocks from the first to fourth divided clocks.

16. The semiconductor device of claim 13, wherein the internal clock generation circuit comprises:

a first transfer circuit configured to generate the first internal clock from one of the first divided clock and the ground voltage according to the first to third mode setting signals;

a second transfer circuit configured to generate the second internal clock from one of the first and second divided clocks and the ground voltage according to the first to third mode setting signals;

a third transfer circuit configured to generate the third internal clock from one of the third divided clock and the ground voltage according to the first to third mode setting signals; and a fourth transfer circuit configured to generate the fourth internal clock from one of the third and fourth divided clocks and the ground voltage according to the first to third mode setting signals.

17. The semiconductor device of claim 16, wherein the first transfer circuit comprises:

a first internal transfer circuit configured to invert and buffer the first divided clock and output a resulting inverted and buffered first divided clock signal to a first node, when the first mode setting signal is enabled;

a second internal transfer circuit configured to invert and buffer the ground voltage and output a resulting inverted and buffered ground voltage signal to the first node, when the second mode setting signal is enabled;

a third internal transfer circuit configured to invert and buffer the first divided clock and output a resulting inverted and buffered first divided clock signal to the first node, when the third mode setting signal is enabled; and a first internal clock output circuit configured to invert and buffer the signal of the first node and output the inverted and buffered signal as the first internal clock.

18. The semiconductor device of claim 16, wherein the second transfer circuit comprises:

a fourth internal transfer circuit configured to invert and buffer the ground voltage and output a resulting inverted and buffered ground voltage signal to a second node, when the first mode setting signal is enabled;

a fifth internal transfer circuit configured to invert and buffer the first divided clock and output a resulting inverted and buffered first divided clock signal to the second node, when the second mode setting signal is enabled;

a sixth internal transfer circuit configured to invert and buffer the second divided clock and output a resulting inverted and buffered second divided clock signal to the second node, when the third mode setting signal is enabled; and a second internal clock output circuit configured to invert and buffer the signal of the second node and output the inverted and buffered signal as the second internal clock.

19. The semiconductor device of claim 16, wherein the third transfer circuit comprises:
   a seventh internal transfer circuit configured to invert and buffer the third divided clock and output a resulting inverted and buffered third divided clock signal to a third node, when the first mode setting signal is enabled;
   an eighth internal transfer circuit configured to invert and buffer the ground voltage and output a resulting inverted and buffered ground voltage signal to the third node, when the second mode setting signal is enabled;
   a ninth internal transfer circuit configured to invert and buffer the third divided clock and output a resulting inverted and buffered third divided clock signal to the third node, when the third mode setting signal is enabled; and
   a third internal clock output circuit configured to invert and buffer the signal of the third node and output the inverted and buffered signal as the third internal clock.

20. The semiconductor device of claim 16, wherein the fourth transfer circuit comprises:
   a tenth internal transfer circuit configured to invert and buffer the ground voltage and output a resulting inverted and buffered ground voltage signal to a fourth node, when the first mode setting signal is enabled;
   an 11th internal transfer circuit configured to invert and buffer the third divided clock and output a resulting inverted and buffered third divided clock signal to the fourth node, when the second mode setting signal is enabled;
   a 12th internal transfer circuit configured to invert and buffer the fourth divided clock and output a resulting inverted and buffered fourth divided clock signal to the fourth node, when the third mode setting signal is enabled; and
   a fourth internal clock output circuit configured to invert and buffer the signal of the fourth node and output the inverted and buffered signal as the fourth internal clock.

21. The semiconductor device of claim 13, wherein the data processing circuit comprises:
   a pipe circuit configured to latch the first to fourth internal data according to the first to fourth input control signals, and output the latched first to fourth internal data as first latch data, second latch data, third latch data, and fourth latch data, according to the first to fourth rising output control signals and the first to fourth falling output control signals; and
   a data sorting circuit configured to generate the first to fourth output data from the first to fourth latch data in synchronization with the first to fourth internal clocks.

22. The semiconductor device of claim 21, wherein the pipe circuit comprises:
   a first pipe latch configured to latch the first internal data according to the first input control signal, and generate the first latch data from the latched first internal data according to one of the first rising output control signal and the first falling output control signal;
   a second pipe latch configured to latch the second internal data according to the second input control signal, and generate the second latch data from the latched second internal data according to one of the second rising output control signal and the second falling output control signal;
   a third pipe latch configured to latch the third internal data according to the third input control signal, and generate the third latch data from the latched third internal data according to one of the third rising output control signal and the third falling output control signal; and
   a fourth pipe latch configured to latch the fourth internal data according to the fourth input control signal, and generate the fourth latch data from the latched fourth internal data according to one of the fourth rising output control signal and the fourth falling output control signal.

23. The semiconductor device of claim 21, wherein the data sorting circuit comprises:
   a first driver configured to drive a fifth node according to the logic level of the first latch data in synchronization with the first internal clock;
   a second driver configured to drive the fifth node according to the logic level of the second latch data in synchronization with the second internal clock;
   a third driver configured to drive the fifth node according to the logic level of the third latch data in synchronization with the third internal clock;
   a fourth driver configured to drive the fifth node according to the logic level of the fourth latch data in synchronization with the fourth internal clock; and
   a transmitter configured to drive the first to fourth output data according to the logic level of the fifth node and output the first to fourth output data to the outside.

24. The semiconductor device of claim 13, further comprising a pipe control circuit configured to generate the first to fourth input control signals from a rising clock and a falling clock according to the first to third mode setting signals, and generate the first to fourth rising output control signals and the first to fourth falling output control signals from the rising clock, the falling clock, and the ground voltage according to the first to third mode setting signals.

25. The semiconductor device of claim 24, wherein the pipe control circuit comprises:
   an input control signal generation circuit configured to generate the first to fourth input control signals which are simultaneously enabled by the rising clock and the falling clock, when one of the first to third mode setting signals is enabled; and
   an output control signal generation circuit configured to generate the first to fourth rising output control signals and the first to fourth falling output control signals from the rising clock, the falling clock, and the ground voltage according to the first to third mode setting signals.

26. The semiconductor device of claim 25, wherein the output control signal generation circuit comprises:
   a first transfer clock generation circuit configured to generate a first transfer clock from the rising clock and the ground voltage according to the first to third mode setting signals;
   a second transfer clock generation circuit configured to generate a second transfer clock from the rising clock, the falling clock, and the ground voltage according to the first to third mode setting signals;
   a rising output control signal generation circuit configured to generate the first to fourth rising output control signals in synchronization with the first transfer clock according to the first to third mode setting signals; and
   a falling output control signal generation circuit configured to generate the first to fourth falling output control signals in synchronization with the second transfer clock according to the first to third mode setting signals.

27. The semiconductor device of claim 26, wherein the first transfer clock generation circuit comprises:
  a first clock transfer circuit configured to invert and buffer the rising clock and output a resulting inverted and buffered rising clock signal to a sixth node, when the first mode setting signal is enabled;
  a second clock transfer circuit configured to invert and buffer the ground voltage and output a resulting inverted and buffered ground voltage signal to the sixth node, when the second mode setting signal is enabled;
  a third clock transfer circuit configured to invert and buffer the rising clock and output a resulting inverted and buffered rising clock signal to the sixth node, when the third mode setting signal is enabled; and
  a first transfer clock output circuit configured to invert and buffer the signal of the sixth node and output the inverted and buffered signal as the first transfer clock.

28. The semiconductor device of claim 26, wherein the second transfer clock generation circuit comprises:
  a fourth clock transfer circuit configured to invert and buffer the ground voltage and output a resulting inverted and buffered ground voltage signal to a seventh node, when the first mode setting signal is enabled;
  a fifth clock transfer circuit configured to invert and buffer the rising clock and output a resulting inverted and buffered rising clock signal to the seventh node, when the second mode setting signal is enabled;
  a sixth clock transfer circuit configured to invert and buffer the falling clock and output a resulting inverted and buffered falling clock signal to the seventh node, when the third mode setting signal is enabled; and
  a second transfer clock output circuit configured to invert and buffer the signal of the seventh node and output the inverted and buffered signal as the second transfer clock.

29. The semiconductor device of claim 26, wherein the rising output control signal generation circuit is configured to:
  generate the first and third rising output control signals which are enabled in synchronization with the first transfer clock when the first mode setting signal is enabled;
  generate the second and fourth rising output control signals which are enabled in synchronization with the first transfer clock when the second mode setting signal is enabled; and
  generate the first to fourth rising output control signals which are enabled in synchronization with the first transfer clock when the third mode setting signal is enabled.

30. The semiconductor device of claim 26, wherein the falling output control signal generation circuit is configured to:
  generate the second and fourth falling output control signals which are enabled in synchronization with the second transfer clock when the first mode setting signal is enabled;
  generate the first and third falling output control signals which are enabled in synchronization with the second transfer clock when the second mode setting signal is enabled; and
  generate the first to fourth falling output control signals which are disabled when the third mode setting signal is enabled.

* * * * *